US012660588B2

(12) United States Patent
Hou et al.

(10) Patent No.:  US 12,660,588 B2
(45) Date of Patent:      Jun. 16, 2026

(54) POWER RAIL ARRANGEMENTS IN INTEGRATED CIRCUITS HAVING STACKED TRANSISTORS

(71) Applicant: TAIWAN SEMICONDUCTOR MANUFACTURING COMPANY, LTD., Hsinchu (TW)

(72) Inventors: Yung-Chin Hou, Hsinchu (TW); Li-Chun Tien, Hsinchu (TW); Chih-LIang Chen, Hsinchu (TW); Chi-Yu Lu, Hsinchu (TW); Wei-Cheng Lin, Hsinchu (TW); Guo-Huei Wu, Hsinchu (TW)

(73) Assignee: TAIWAN SEMICONDUCTOR MANUFACTURING COMPANY, LTD., Hsinchu (TW)

( * ) Notice:  Subject to any disclaimer, the term of this patent is extended or adjusted under 35 U.S.C. 154(b) by 516 days.

(21) Appl. No.: 18/304,679

(22) Filed:  Apr. 21, 2023

(65) Prior Publication Data

US 2024/0355707 A1      Oct. 24, 2024

(51) Int. Cl.
*H01L 23/48*      (2006.01)
*H10D 30/01*      (2025.01)
(Continued)

(52) U.S. Cl.
CPC ......... *H01L 23/481* (2013.01); *H10D 30/014* (2025.01); *H10D 30/43* (2025.01);
(Continued)

(58) Field of Classification Search
CPC . H01L 23/481; H01L 23/5286; H10D 30/014;

H10D 30/43; H10D 30/6735; H10D 30/6757; H10D 62/121; H10D 84/0186; H10D 84/038; H10D 84/85; H10D 88/00; H10D 88/01

See application file for complete search history.

(56) References Cited

U.S. PATENT DOCUMENTS

| | | | | |
|---|---|---|---|---|
| 2020/0328212 A1* | 10/2020 | Wu | ......................... | H10D 88/00 |
| 2022/0271033 A1* | 8/2022 | Chanemougame | .... | H10D 84/85 |
| 2023/0036522 A1* | 2/2023 | Chen | ................. | H10D 84/0149 |

FOREIGN PATENT DOCUMENTS

TW      202310192      3/2023

* cited by examiner

*Primary Examiner* — Jonathan Han
(74) *Attorney, Agent, or Firm* — Hauptman Ham, LLP

(57)      ABSTRACT

An integrated circuit device includes a first-type active-region semiconductor structure extending and a second-type active-region semiconductor structure both extending in a first direction. The second-type active-region semiconductor structure is stacked with the first-type active-region semiconductor structure. The integrated circuit device also includes a front-side conductive layer above the two active-region semiconductor structures and a back-side conductive layer below the two active-region semiconductor structures. The integrated circuit device still includes a front-side power rail extending in the second direction in the front-side conductive layer and a back-side power rail extending in the second direction in the back-side conductive layer. The integrated circuit device further includes a first source conductive segment connected to the front-side power rail and a second source conductive segment connected to the back-side power rail.

20 Claims, 28 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10D 84/85* | (2025.01) |

(52) U.S. Cl.
CPC ..... *H10D 30/6735* (2025.01); *H10D 30/6757* (2025.01); *H10D 62/121* (2025.01); *H10D 84/0186* (2025.01); *H10D 84/038* (2025.01); *H10D 84/85* (2025.01)

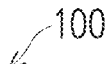
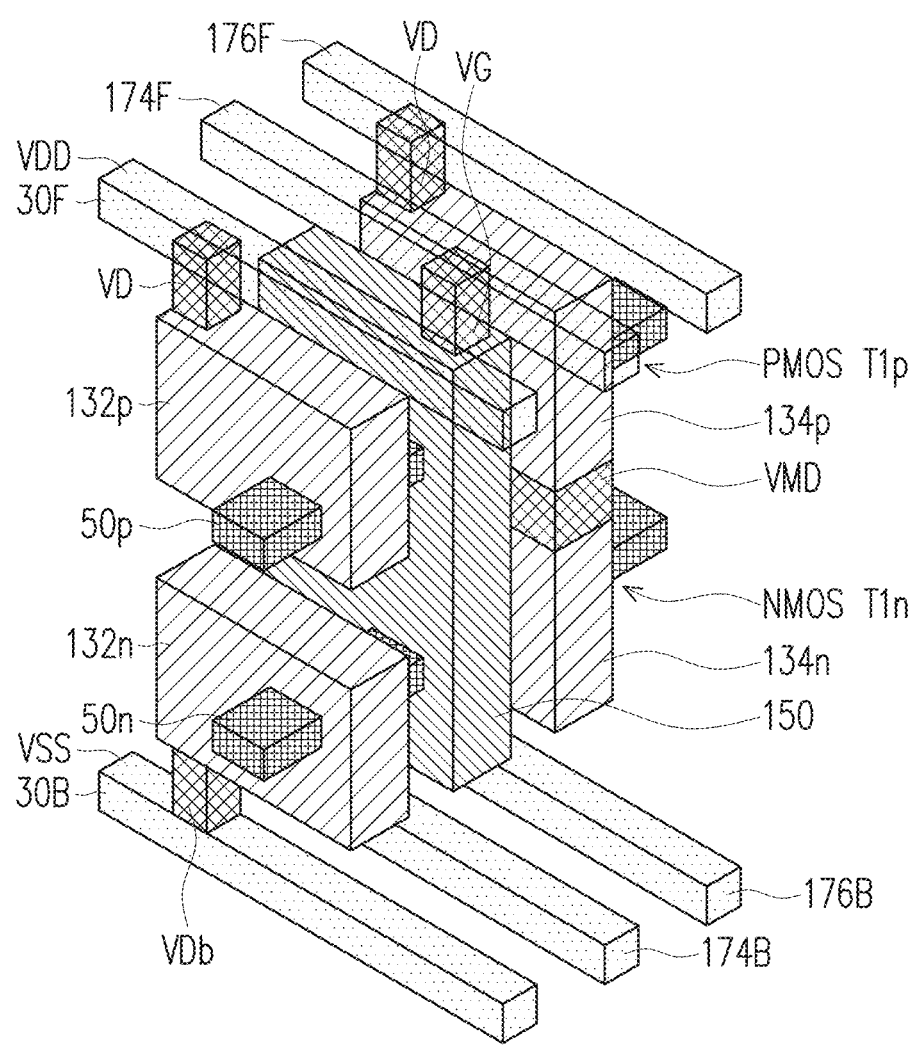
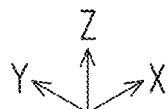
FIG. 1

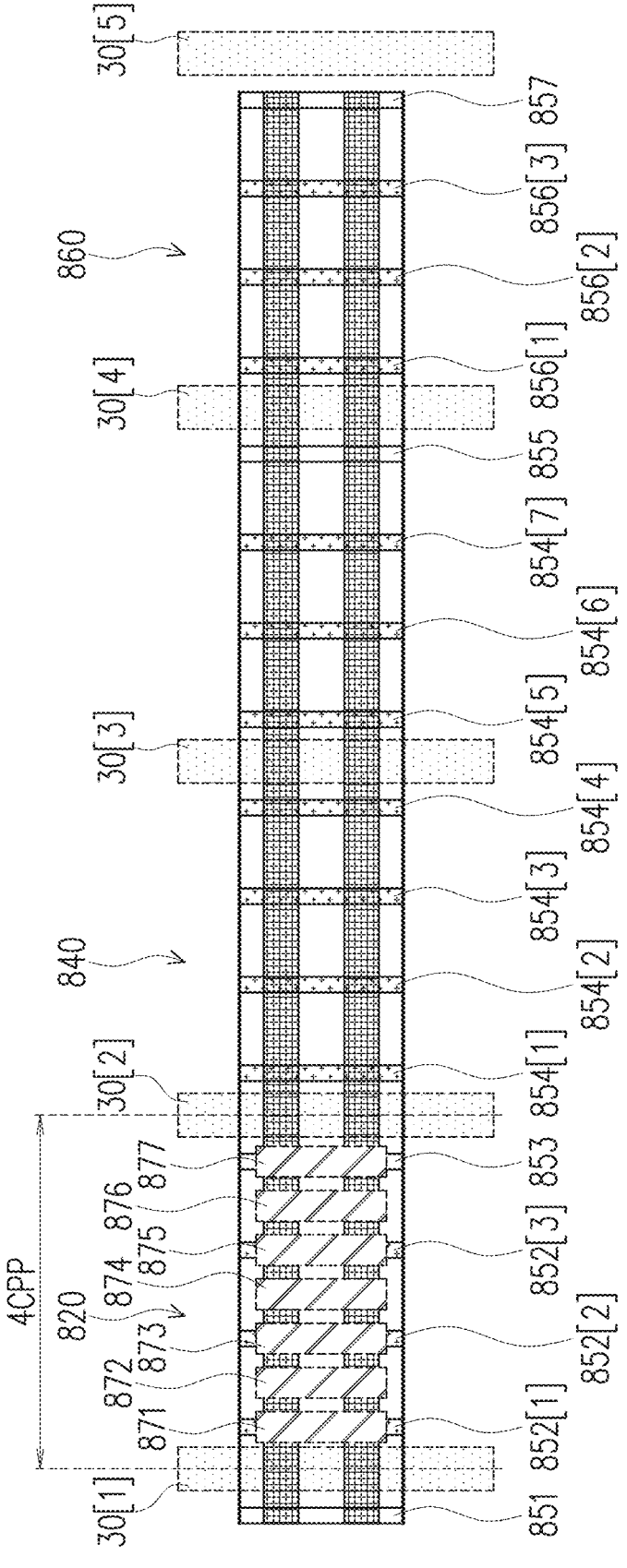
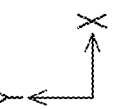
FIG. 8A

1700

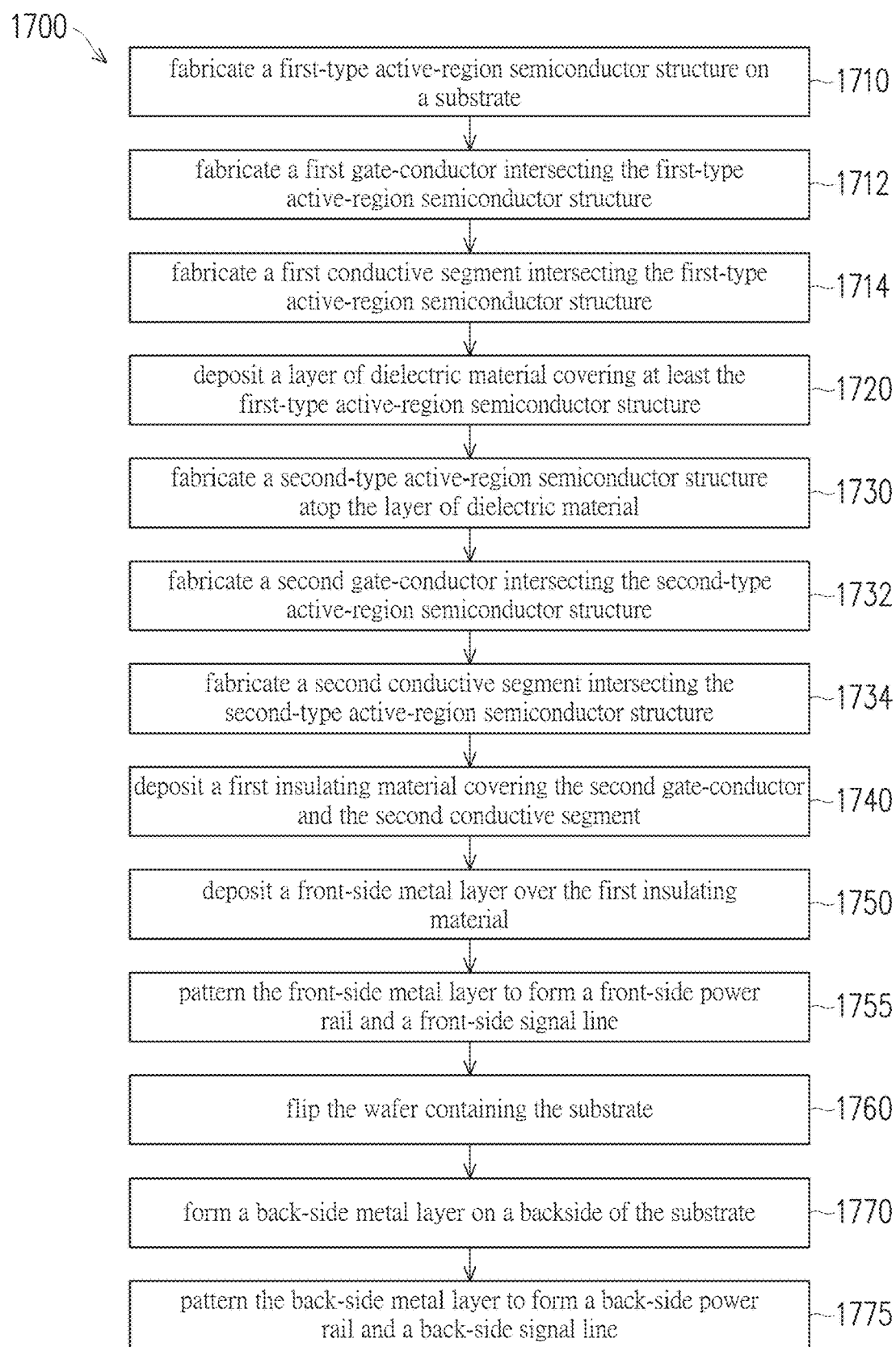

fabricate a first-type active-region semiconductor structure on a substrate —1710 fabricate a first gate-conductor intersecting the first-type active-region semiconductor structure —1712 fabricate a first conductive segment intersecting the first-type active-region semiconductor structure —1714 deposit a layer of dielectric material covering at least the first-type active-region semiconductor structure —1720 fabricate a second-type active-region semiconductor structure atop the layer of dielectric material —1730 fabricate a second gate-conductor intersecting the second-type active-region semiconductor structure —1732 fabricate a second conductive segment intersecting the second-type active-region semiconductor structure —1734 deposit a first insulating material covering the second gate-conductor and the second conductive segment —1740 deposit a front-side metal layer over the first insulating material —1750 pattern the front-side metal layer to form a front-side power rail and a front-side signal line —1755 flip the wafer containing the substrate —1760 form a back-side metal layer on a backside of the substrate —1770 pattern the back-side metal layer to form a back-side power rail and a back-side signal line —1775

FIG. 17

POWER RAIL ARRANGEMENTS IN INTEGRATED CIRCUITS HAVING STACKED TRANSISTORS

BACKGROUND

An integrated circuit (IC) typically includes a number of IC devices that are manufactured in accordance with one or more IC layout diagrams. IC devices sometimes include complementary field effect transistor (CFET) devices. A CFET device generally has an upper FET overlying a lower FET in a stacked configuration. Both the upper FET and the lower FET in a CFET device are positioned above the conductive lines in a back-side conductive layer but below the conductive lines in a front-side conductive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram of an inverter circuit, in accordance with some embodiments.

FIGS. 8A-8C are layout diagrams of an integrated circuit having a row of circuit cells, in accordance with some embodiments.

FIG. 17 is a flowchart of a method 1700 of manufacturing an integrated circuit (IC) having CFET devices, in accordance with some embodiments.

DETAILED DESCRIPTION

Figure 2A:
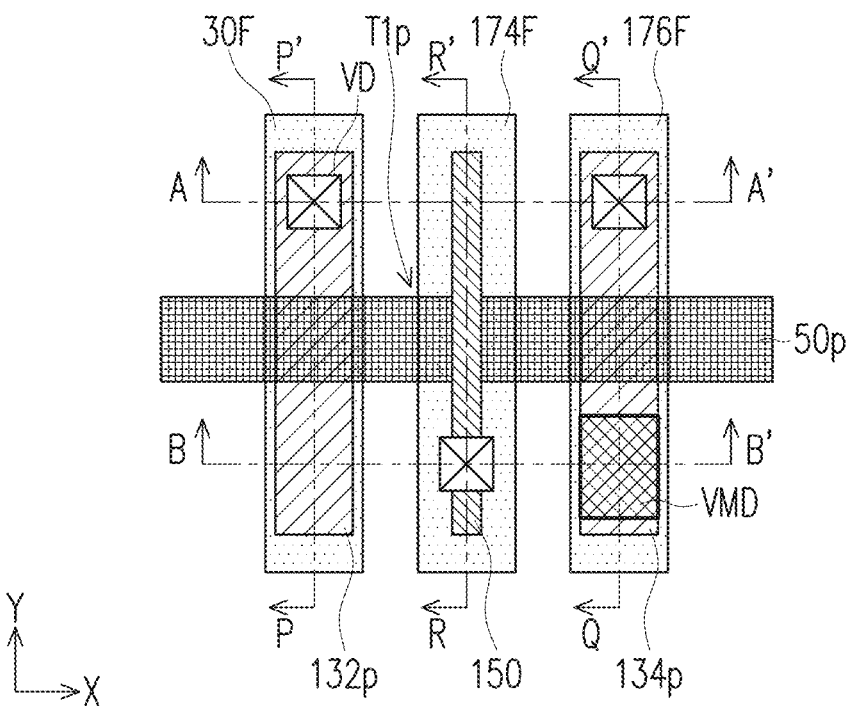
FIGS. 2A-2B are layout diagrams of the inverter circuit depicted in FIG. 1, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary field effect transistor (CFET transistor) generally has a first-type transistor stacked with a second-type transistor. The first-type transistor has a channel region in a first-type active-region semiconductor structure, and the second-type transistor has a channel region in a second-type active-region semiconductor structure. An IC device having CFET transistors often includes a front-side conductive layer above the CFET transistors and a back-side conductive layer below the CFET transistors. In some embodiments, each of the first-type active-region semiconductor structure and the second-type active-region semiconductor structure extends in a first direction. The layout design of the front-side power rails in the first front-side conductive layer having front-side signal lines has impact to the layout areas of the circuit cells. The layout design of the back-side power rails in the first back-side conductive layer having back-side signal lines also has impact to the layout areas of the circuit cells. When the front-side power rails in the first front-side conductive layer and/or the back-side power rails in the first back-side conductive layer extend in a second direction that is perpendicular to the first direction, some implementations of circuit cells have reduced cell heights while preventing additional increases of IR drops in the power rails.

FIG. 1 is a diagram of an inverter circuit 100, implemented with CFETs, having power rails and signal lines in both a front-side conductive layer and a back-side conductive layer, in accordance with some embodiments. The inverter circuit 100 includes a PMOS transistor T1$p$ and a NMOS transistor T1$n$. The gate terminals of the PMOS transistor T1$p$ and the NMOS transistor Tin are connected together while functioning as an input terminal of the inverter. The drain terminals of the PMOS transistor T1$p$ and the NMOS transistor Tin are connected together while functioning as an output terminal of the inverter. The source terminals of the PMOS transistor T1$p$ and the NMOS transistor T1$n$ are correspondingly maintained at an upper supply voltage VDD and a lower supply voltage VSS.

In FIG. 1, inverter circuit 100 incudes a p-type active-region semiconductor structure 50$p$ extending in the X-direction and an n-type active-region semiconductor structure 50$n$ extending in the X-direction. The X-direction, the Y-direction, and the Z-direction in FIG. 1 are mutually orthogonal to each other and form an orthogonal coordinate frame. The p-type active-region semiconductor structure 50$p$ is stacked with the n-type active-region semiconductor structure 50$n$ and shifted from the n-type active-region semiconductor structure along the Z-direction. A gate-conductor 150 extending in the Y-direction intersects both the p-type active-region semiconductor structure 50$p$ and the n-type active-region semiconductor structure 50$n$. The gate-conductor 150 functions as two stacked gate-conductors conductively joined together: one of the two gate-conductors intersects the p-type active-region semiconductor structure 50$p$ at a channel region of the PMOS transistor T1$p$, and another one of the two gate-conductors intersects the n-type active-region semiconductor structure 50$n$ at a channel region of the NMOS transistor T1$n$. The gate-conductor 150 is conductively connected to the gate terminals of the PMOS transistor T1$p$ and the NMOS transistor T1$n$.

In some embodiments, each of the p-type active-region semiconductor structure 50$p$ and the n-type active-region semiconductor structure 50$n$ includes one or more nano-sheets, and consequently, each of the PMOS transistor T1$p$ and the NMOS transistor Tin is a nano-sheet transistor. In some embodiments, each of the p-type active-region semiconductor structure 50$p$ and the n-type active-region semiconductor structure 50$n$ includes one or more nano-wires, and consequently, each of the PMOS transistor T1$p$ and the NMOS transistor Tin is a nano-wire transistor.

In FIG. 1, The inverter circuit 100 also includes conductive segments 132$p$, 134$p$, 132$n$, and 134$n$. Each of the conductive segments 132$p$ and 134$p$, extending in the Y-direction, intersects the p-type active-region semiconductor structure 50$p$ at one of the terminal regions of the PMOS transistor T1$p$. Each of the conductive segments 132$n$ and 134$n$, extending in the Y-direction, intersects the n-type active-region semiconductor structure 50$n$ at one of the terminal regions of the NMOS transistor T1$n$. A terminal region of a transistor is either a source region or a drain region of the transistor. The conductive segment 132$p$, as a source conductive segment, forms a source terminal of the PMOS transistor T1$p$. The conductive segment 132$n$, as a source conductive segment, forms a source terminal of the NMOS transistor T1$n$. The conductive segment 134$p$, as a drain conductive segment, forms a drain terminal of the PMOS transistor T1$p$. The conductive segment 134$n$, as a drain conductive segment, forms a drain terminal of the NMOS transistor T1$n$. The conductive segment 134$p$ and the conductive segment 134$n$ are conductively connected through a conductive-segment inter-connector VMD. While the drain terminals of the PMOS transistor T1$p$ and the NMOS transistor T1$n$ are conductively connected together by the conductive-segment inter-connector VMD, the source terminal of the PMOS transistor T1$p$ is conductively connected to a front-side power rail 30F through a front-side via-connector VD, and the source terminal of the NMOS transistor Tin is conductively connected to a back-side power rail 30B through a back-side via-connector VDb. The front-side power rail 30F is configured to be held at an upper supply voltage VDD, and the back-side power rail 30B is configured to be held at a lower supply voltage VSS.

The front-side power rail 30F extending in the Y-direction is in a front-side conductive layer. The back-side power rail 30B extending in the Y-direction is in a back-side conductive layer. Each of the front-side conductive layer and the back-side conductive layer is in a plane having the normal vector orientated towards the Z-direction. The front-side conductive layer is above both the p-type active-region semiconductor structure 50$p$ and the n-type active-region semiconductor structure 50$n$. The back-side conductive layer is below both the p-type active-region semiconductor structure 50$p$ and the n-type active-region semiconductor structure 50$n$. In some embodiments, the back-side conductive layer is fabricated on a substrate as a buried conductive layer, and then, the n-type active-region semiconductor structure 50$n$ is fabricated above the buried conductive layer. Subsequently, the p-type active-region semiconductor structure 50$p$ is fabricated above the n-type active-region semiconductor structure 50$n$, and the front-side conductive layer is fabricated above the p-type active-region semiconductor structure 50$p$. Other arrangements of the back-side conductive layer are also within the contemplated scope of the present disclosure.

In FIG. 1, the inverter circuit 100 includes front-side signal lines 174F and 176F in the front-side conductive layer and also back-side signal lines 174B and 176B in the back-side conductive layer. Each of the front-side signal lines 174F and 176F and the back-side signal lines 174B and 176B extends in the Y-direction. The front-side signal line 174F is conductively connected to the gate-conductor 150 through a front-side via-connector VG and configured as an input signal line of the inverter circuit. The front-side signal line 176F is conductively connected to the conductive segment 134$p$ through a via-connector VD and configured as an output signal line of the inverter circuit. The front-side power rail 30F is conductively connected to the conductive segment 132$p$ through a front-side via-connector VD, and the back-side power rail 30B is conductively connected to the conductive segment 132$n$ through a back-side via-connector VDb.

In some embodiments, even though the back-side signal lines 174B and 176B in FIG. 1 are not directly connected to any circuit nodes in the inverter circuit 100, the back-side signal lines 174B and 176B are configured to route signals between neighboring cells at opposite sides of the inverter circuit. For example, in some embodiments, a signal is transmitted along the Y-direction, through one of the back-side signal lines 174B and 176B, from a first neighboring cell at a first side of the inverter circuit 100 to a second neighboring cell at a second side of the inverter circuit 100.

Figure 2B:
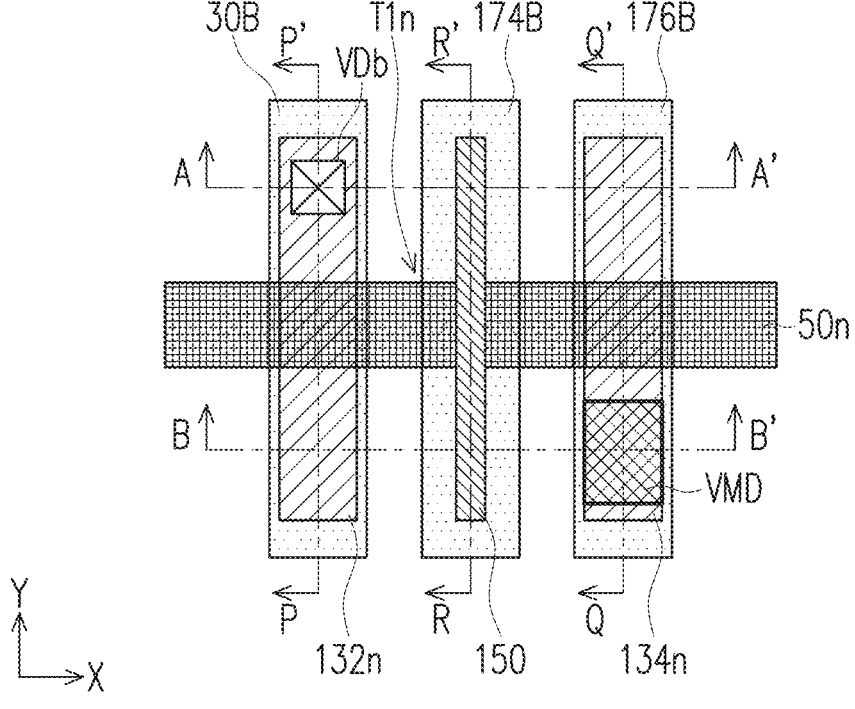

FIGS. 2A-2B are layout diagrams of the inverter circuit 100 depicted in FIG. 1, in accordance with some embodiments. The layout diagram of FIG. 2A includes the layout patterns for specifying the p-type active-region semiconductor structure 50p, the gate-conductor 150, the conductive segments 132p and 134p, the front-side signal lines 174F and 176F, the front-side power rail 30F, the conductive-segment inter-connector VMD, and various via-connectors. The layout diagram of FIG. 2B includes the layout patterns for specifying the n-type active-region semiconductor structure 50n, the gate-conductor 150, the conductive segments 132n and 134n, the back-side signal lines 174B and 176B, the back-side power rail 30B, the conductive-segment inter-connector VMD, and various via-connectors.

As specified by the layout diagram of FIG. 2A, each of the p-type active-region semiconductor structure 50p, the front-side signal lines 174F and 176F, and the front-side power rail 30F are extending in the Y-direction. The gate-conductor 150 extending in the Y-direction intersects the p-type active-region semiconductor structure 50p at the channel region of the PMOS transistor T1p. The conductive segment 132p extending in the Y-direction intersects the p-type active-region semiconductor structure 50p at the source region of the PMOS transistor T1p. The conductive segment 134p extending in the Y-direction intersects the p-type active-region semiconductor structure 50p at the drain region of the PMOS transistor T1p.

The via-connector pattern VD overlapping both the conductive segment 132p and the front-side power rail 30F specifies that the conductive segment 132p and the front-side power rail 30F are conductively connected together through a front-side via-connector VD. The top via-connector pattern VG overlapping both the gate-conductor 150 and the front-side signal line 174F specifies that the gate-conductor 150 and the front-side signal line 174F are conductively connected together through a front-side via-connector VG. The via-connector pattern VD overlapping both the conductive segment 134p and the front-side signal line 176F specifies that the conductive segment 134p and the front-side signal line 176F are conductively connected together through a front-side via-connector VD.

As specified by the layout diagram of FIG. 2B, each of the n-type active-region semiconductor structure 50n, the back-side signal lines 174B and 176B, and the back-side power rail 30B are extending in the X-direction. The gate-conductor 150 extending in the Y-direction intersects the n-type active-region semiconductor structure 50n at the channel region of the NMOS transistor T1n. The conductive segment 132n extending in the Y-direction intersects the n-type active-region semiconductor structure 50n at the source region of the NMOS transistor T1n. The conductive segment 134n extending in the Y-direction intersects the n-type active-region semiconductor structure 50n at the drain region of the NMOS transistor T1n. The via-connector pattern VDb overlapping both the conductive segment 132n and the back-side power rail 30B specifies that, in the inverter circuit 100, the conductive segment 132n and the back-side power rail 30B are conductively connected together through a back-side via-connector VDb.

The inter-connector pattern VMD (which overlies the conductive segment 134p) in FIG. 2A and the inter-connector pattern VMD (which overlies the conductive segment 134n) in FIG. 2B are matched with each other at same positions in the X-Y coordinate. The matched inter-connector patterns VMD in the layout diagrams specify that the conductive segment 134p and the conductive segment 134n in the inverter circuit 100 are conductively connected together through a conductive-segment inter-connector VMD.

Figure 3A:
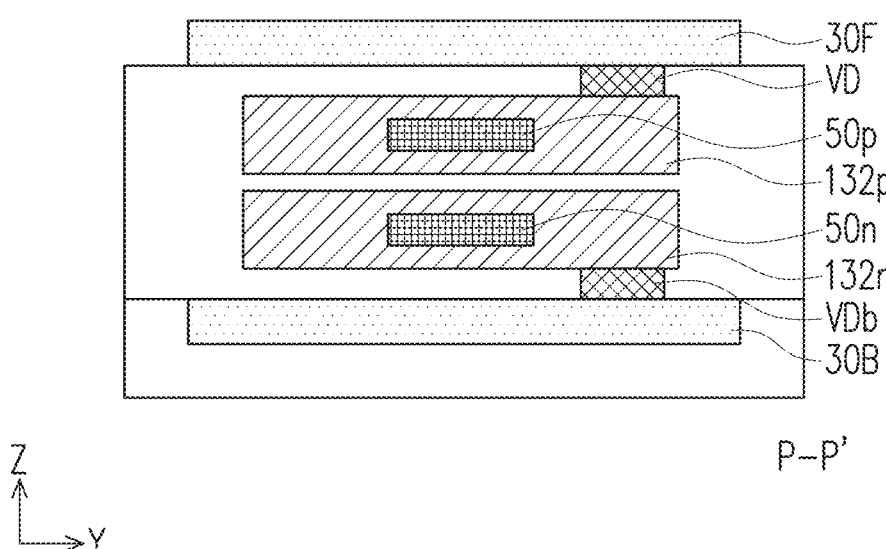
FIGS. 3A-3C are cross-sectional views of the inverter circuit of FIG. 1 in various cutting planes as specified by the layout diagrams of FIGS. 2A-2B, in accordance with some embodiments.
Figure 3B:
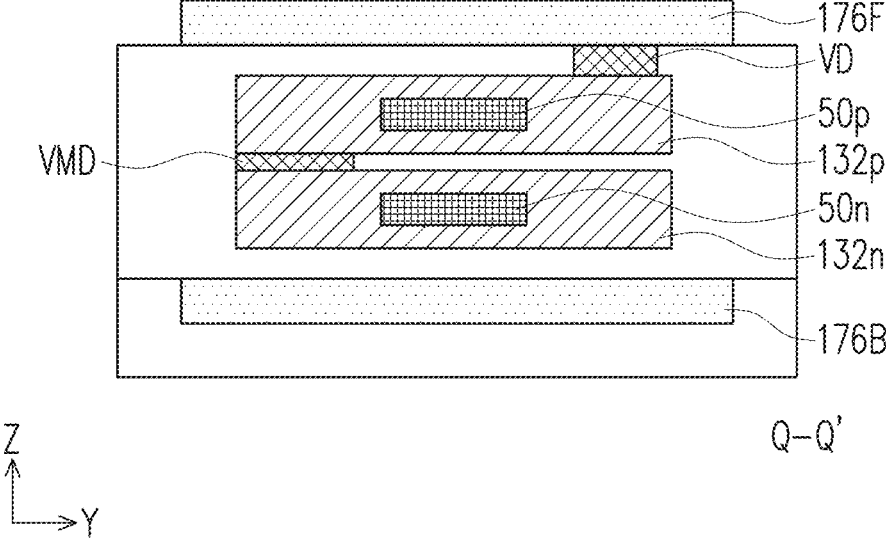
Figure 3C:
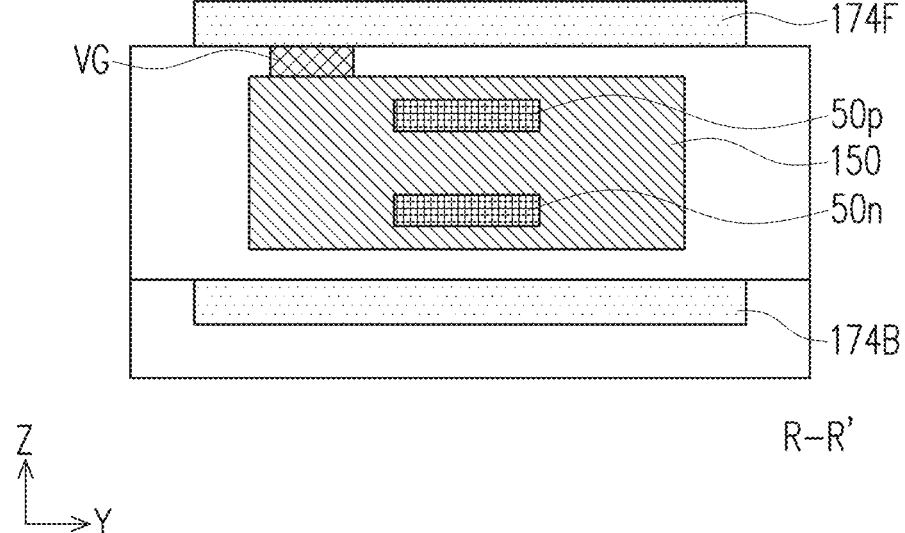
Figure 4A:
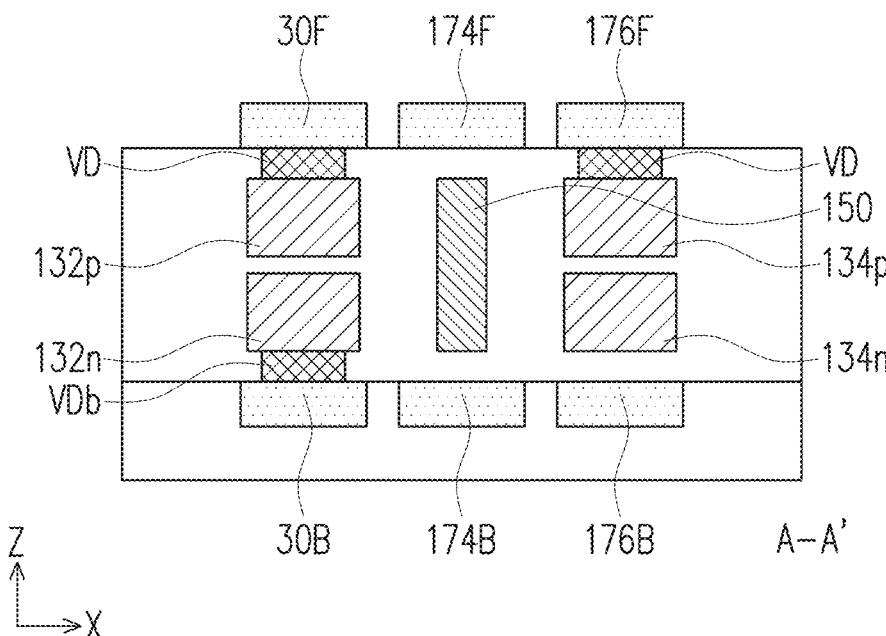
FIGS. 4A-4B are cross-sectional views of the inverter circuit of FIG. 1 in various cutting planes as specified by the layout diagrams of FIGS. 2A-2B, in accordance with some embodiments.
Figure 4B:
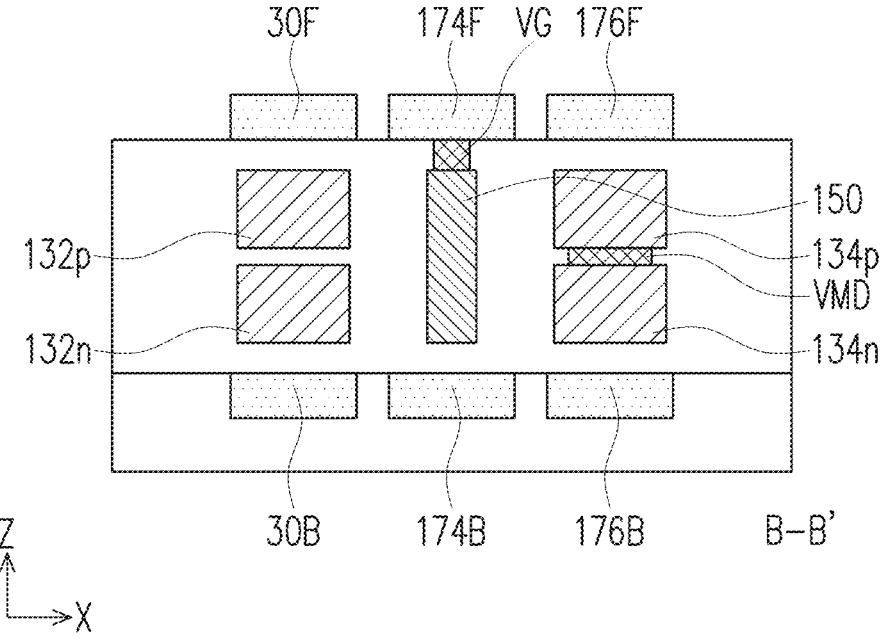

FIG. 3A is a cross-sectional view of the inverter circuit 100 of FIG. 1 in the cutting plane as specified by the line P-P' in the layout diagrams of FIGS. 2A-2B, in accordance with some embodiments. FIG. 3B is a cross-sectional view of the inverter circuit 100 of FIG. 1 in the cutting plane as specified by the line Q-Q' in the layout diagrams of FIGS. 2A-2B, in accordance with some embodiments. FIG. 3C is a cross-sectional view of the inverter circuit 100 of FIG. 1 in the cutting plane as specified by the line R-R' in the layout diagrams of FIGS. 2A-2B, in accordance with some embodiments. FIG. 4A is a cross-sectional view of the inverter circuit 100 of FIG. 1 in the cutting plane as specified by the line A-A' in the layout diagrams of FIGS. 2A-2B, in accordance with some embodiments. FIG. 4B is a cross-sectional view of the inverter circuit 100 of FIG. 1 in the cutting plane as specified by the line B-B' in the layout diagrams of FIGS. 2A-2B, in accordance with some embodiments.

In FIGS. 3A-3C and FIGS. 4A-4B, the p-type active-region semiconductor structure 50p is stacked with n-type active-region semiconductor structure 50n. The front-side signal lines 174F and 176F and the front-side power rail 30F are in the front-side conductive layer which is above the p-type active-region semiconductor structure 50p and the n-type active-region semiconductor structure 50n. The back-side signal lines 174B and 176B and the back-side power rail 30B are in the back-side conductive layer which is below the p-type active-region semiconductor structure 50p and the n-type active-region semiconductor structure 50n.

In the cross-sectional view of the P-P' cutting plane, as shown in FIG. 3A, the conductive segment 132p intersects the p-type active-region semiconductor structure 50p at a source region of the PMOS transistor, and the conductive segment 132n intersects the n-type active-region semiconductor structure 50n at a source region of the NMOS transistor. The conductive segment 132p is conductively connected to the front-side power rail 30F through a front-side via-connector VD, and the conductive segment 132n is conductively connected to the back-side power rail 30B through a back-side via-connector VDb.

In the cross-sectional view of the Q-Q' cutting plane, as shown in FIG. 3B, the conductive segment 134p intersects the p-type active-region semiconductor structure 50p at a drain region of the PMOS transistor, and the conductive segment 134n intersects the n-type active-region semiconductor structure 50n at a drain region of the NMOS transistor. The conductive segment 134n is conductively connected to the front-side signal line 176F through a front-side via-connector VD. The conductive segment 134p is conductively connected to the conductive segment 134n through a conductive-segment inter-connector VMD.

In the cross-sectional view of the R-R' cutting plane, as shown in FIG. 3C, the gate-conductor 150 intersects the p-type active-region semiconductor structure 50p at a channel region of the PMOS transistor and intersects the n-type active-region semiconductor structure 50n at a channel region of the NMOS transistor. The front-side signal line 174F is conductively connected to the gate-conductor 150 through a front-side via-connector VG.

In the cross-sectional views of the A-A' cutting plane in FIG. 4A and the B-B' cutting plane in FIG. 4B, the front-side signal lines 174F and 176F and the front-side power rail 30F are in the front-side conductive layer, while the back-side signal lines 174B and 176B and the back-side power rail 30B are in the back-side conductive layer. The gate-conductor 150 and the conductive segments 132p, 132n. 234p, and 134p are all between the front-side conductive layer and the back-side conductive layer. The front-side power rail 30F is aligned with the conductive segment 132*p* below the front-side conductive layer, the front-side signal line 174F is aligned with the gate-conductor 150 below the front-side conductive layer, and the front-side signal line 176F is aligned with the conductive segment 134*p* below the front-side conductive layer. The back-side power rail 30B is aligned with the conductive segment 132*n* above the back-side conductive layer, the back-side signal line 174B is aligned with the gate-conductor 150 above the back-side conductive layer, and the back-side signal line 176B is aligned with the conductive segment 134*n* above the back-side conductive layer.

In the cross-sectional views of the A-A' cutting plane in FIG. 4A, the front-side power rail 30F is conductively connected to the conductive segment 132*p* through a front-side via-connector VD, and the front-side signal line 176F is conductively connected to the conductive segment 134*p* through a via-connector VD. The back-side power rail 30B is conductively connected to the conductive segment 132*n* through a back-side via-connector VDb.

In the cross-sectional views of the B-B' cutting plane in the B-B' cutting plane in FIG. 4B, the front-side signal line 174F is conductively connected to the gate-conductor 150 through a front-side via-connector VG. The conductive segment 134*p* is conductively connected to the conductive segment 134*n* through a conductive-segment inter-connector VMD.

Figure 5A:
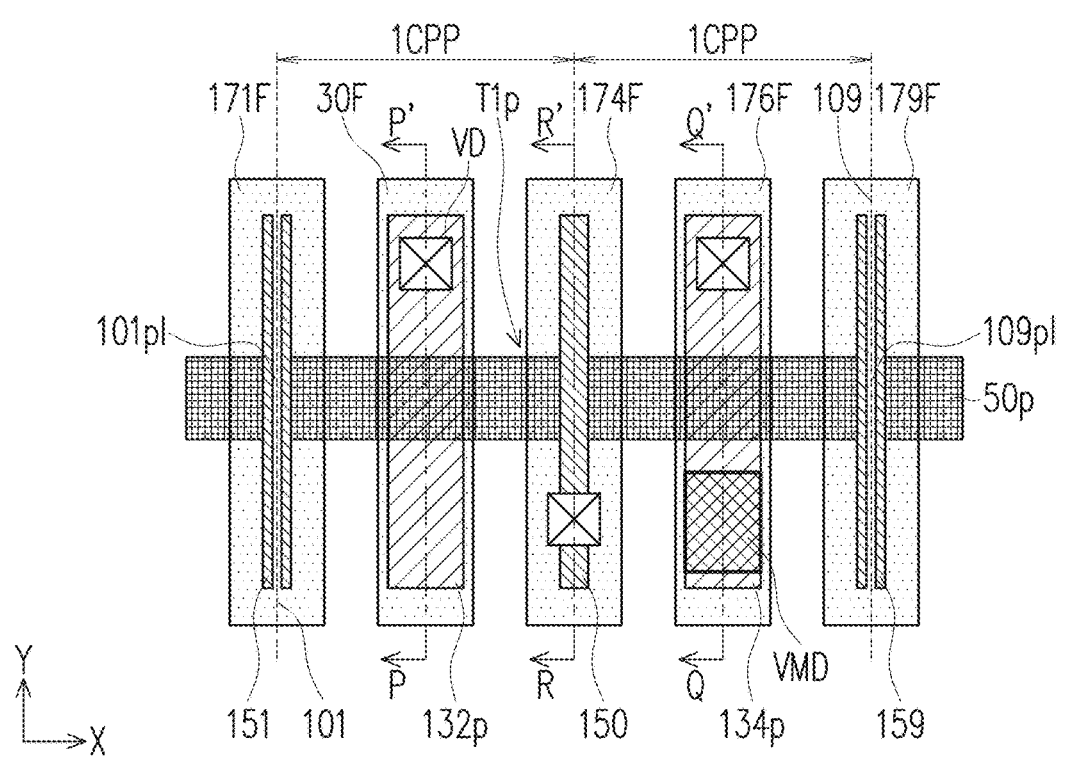
FIGS. 5A-5B are layout diagrams of an inverter circuit, in accordance with some embodiments.
Figure 5B:
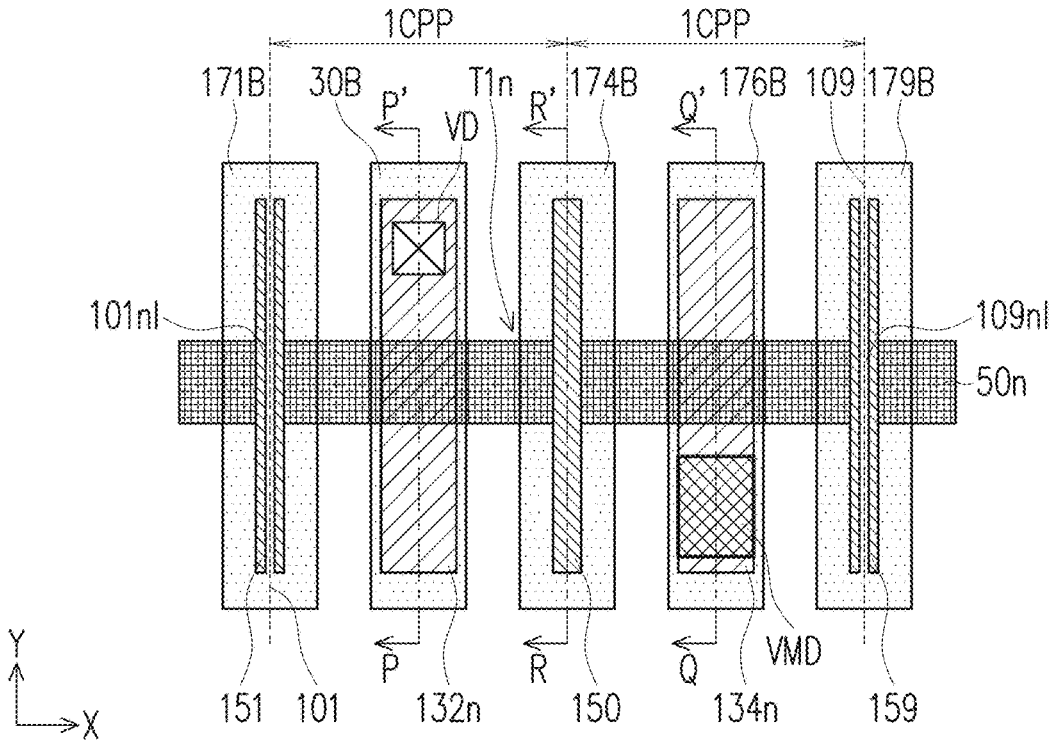

In some embodiments, the inverter circuit 100 depicted in FIG. 1 is implemented in a circuit cell. FIGS. 5A-5B. FIGS. 6A-6B, and FIGS. 7A-7B are layout diagrams of circuit cells having the inverter circuit 100, in accordance with some embodiments.

In each layout diagram of FIGS. 5A-5B, FIGS. 6A-6B, and FIGS. 7A-7B, a vertical cell boundary 101 of the circuit cell is aligned with a dummy gate-conductor 151, while a vertical cell boundary 109 of the circuit cell is aligned with a dummy gate-conductor 159. Each of the dummy gate-conductors 151 and 159 is separated from the gate-conductor 150 with a pitch distance that is equal to one Contacted Poly Pitch ("CPP") distance.

The vertical cell boundary 101 (which extends in the Y-direction) passes through a boundary isolation region 101*p*I in the p-type active-region semiconductor structure 50*p* and through a boundary isolation region 101*n*I in the n-type active-region semiconductor structure 50*n*. The boundary isolation region 101*p*I is identifiable at an intersection between the dummy gate-conductor 151 and the p-type active-region semiconductor structure 50*p*, while the boundary isolation region 101*n*I is identifiable at an intersection between the dummy gate-conductor 151 and the n-type active-region semiconductor structure 50*n*.

The vertical cell boundary 109 (which extends in the Y-direction) passes through a boundary isolation region 109*p*I in the p-type active-region semiconductor structure 50*p* and through a boundary isolation region 109*n*I in the n-type active-region semiconductor structure 50*n*. The boundary isolation region 109*p*I is identifiable at an intersection between the dummy gate-conductor 159 and the p-type active-region semiconductor structure 50*p*, while the boundary isolation region 109*n*I is identifiable at an intersection between the dummy gate-conductor 159 and the n-type active-region semiconductor structure 50*n*.

Because of the boundary isolation regions 101*p*I and 109*p*I, the active-regions (e.g., the source region, the channel region, and the drain region) of the PMOS transistor in the circuit cell (which has the inverter circuit 100) between the vertical cell boundaries 101 and 109 are isolated from the active-regions of the neighboring cells in the p-type active-region semiconductor structure 50*p*. Similar, because of the boundaries isolation regions 101*n*I and 109*n*I, the active-regions (e.g., the source region, the channel region, and the drain region) of the NMOS transistor in the circuit cell (which has the inverter circuit 100) between the vertical cell boundaries 101 and 109 are isolated from the active-regions of the neighboring cells in the n-type active-region semiconductor structure 50*n*. Various suitable technologies for generating the boundaries isolation regions in the active-region semiconductor structures (50*p* or 50*n*) are within the contemplated scope of present disclosure. For example, in some embodiments, the boundaries isolation regions in the active-region semiconductor structures (50*p* or 50*n*) are created based on the continuous poly on oxide definition (CPODE) technology. In some other embodiments, the boundaries isolation regions in the active-region semiconductor structures (50*p* or 50*n*) are created based on the poly on oxide definition edge (PODE) technology.

The layout diagrams in FIGS. 5A-5B are modified from the layout diagrams in FIGS. 2A-2B. The modification includes adding the dummy gate-conductors 151 and 159 correspondingly at the vertical cell boundaries 101 and 109 of the circuit cell that has the inverter circuit 100, while the inverter circuit 100 is implemented with the layout as specified by the layout diagrams in FIGS. 2A-2B. The modification also includes adding front-side signal lines 171F and 179F in the front-side conductive layer and adding back-side signal lines 171B and 179B in the back-side conductive layer. The front-side signal lines 171F and 179F, each of which extends in the Y-direction in the front-side conductive layer, are correspondingly aligned with the vertical cell boundaries 101 and 109. The back-side signal lines 171B and 179B, each of which extends in the Y-direction in the back-side conductive layer, are correspondingly aligned with the vertical cell boundaries 101 and 109.

In some embodiments, the front-side signal lines 171F is separated from the front-side power rail 30F with a pitch distance of 0.5 CPP, the front-side signal line 179F is separated from the front-side signal line 176F with a pitch distance of 0.5 CPP, and the front-side signal line 174F is separated from each of the front-side signal line 176F and the front-side power rail 30F with a pitch distance of 0.5 CPP. In some embodiments, the back-side signal lines 171B is separated from the back-side power rail 30B with a pitch distance of 0.5 CPP, the back-side signal line 179B is separated from the back-side signal line 176B with a pitch distance of 0.5 CPP, and the back-side signal line 174B is separated from each of the back-side signal line 176B and the back-side power rail 30B with a pitch distance of 0.5 CPP.

Figure 6A:
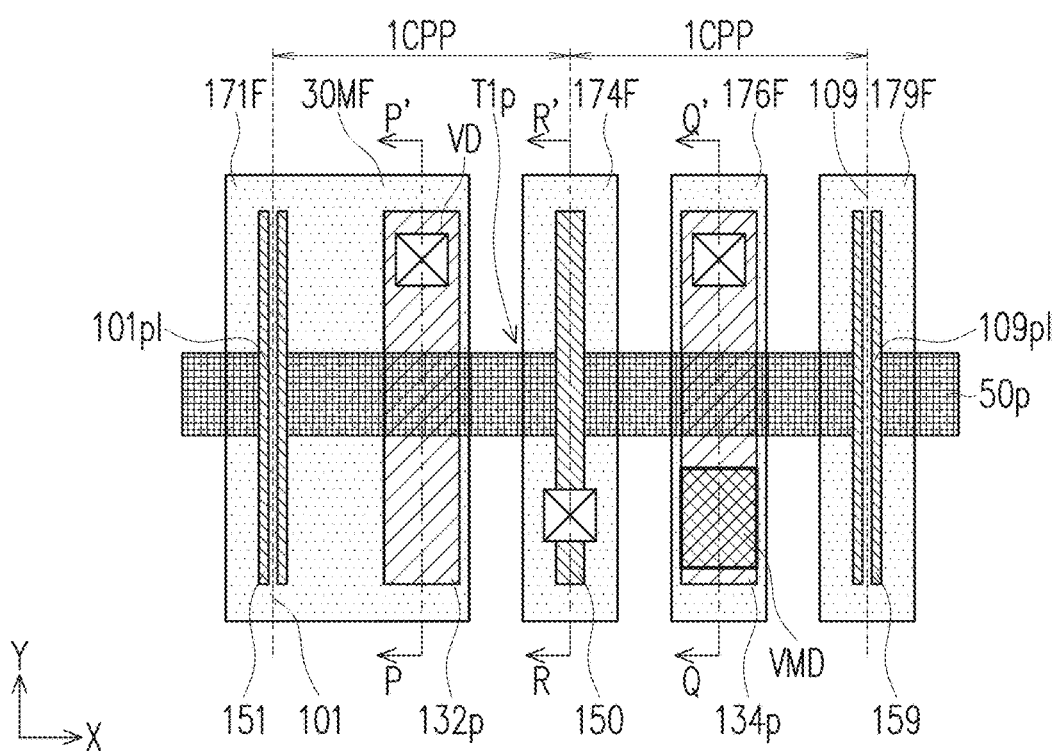
FIGS. 6A-6B are layout diagrams of an inverter circuit, in accordance with some embodiments.
Figure 6B:
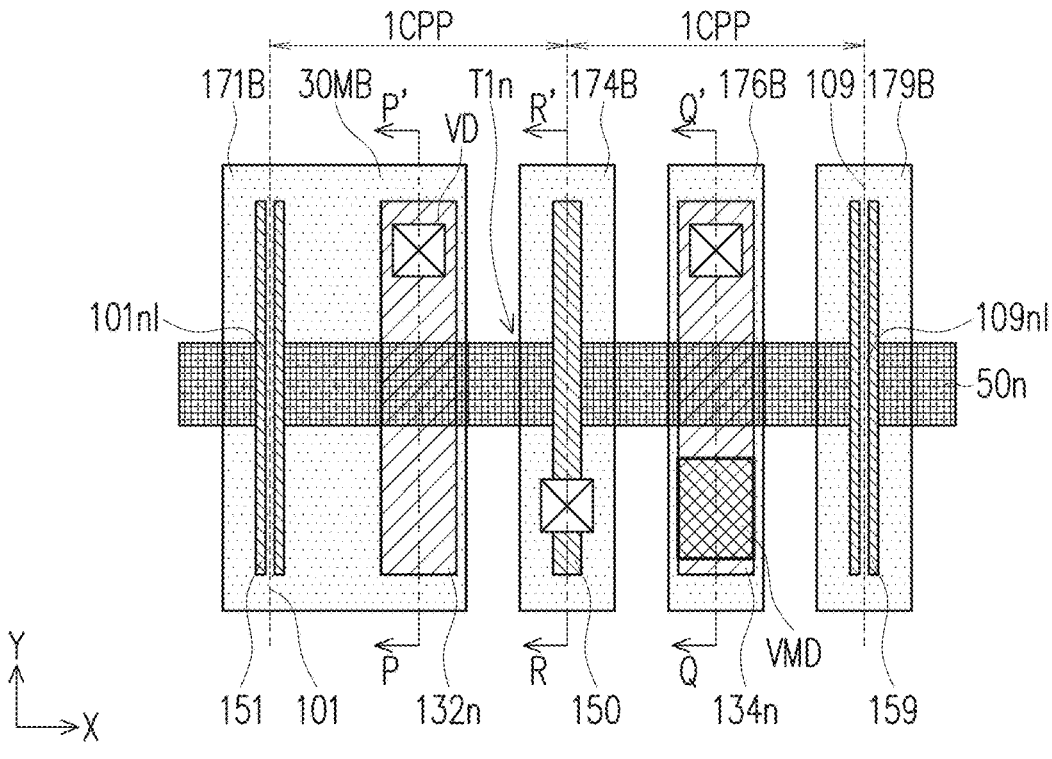

The layout diagrams in FIGS. 6A-6B are modified from the layout diagrams in FIGS. 5A-5B. The modification includes merging the front-side signal lines 171F and the front-side power rail 30F in FIG. 5A as a widened front-side power rail 30MF in FIG. 6A. The modification also includes merging the back-side signal lines 171B and the back-side power rail 30B in FIG. 5B as a widened back-side power rail 30MB in FIG. 6B. The widened power rails (such as 30MF and 30MB) in FIGS. 6A-6B have reduced IR drops, as compared with the corresponding power rails (such as 30F and 30B) in FIGS. 5A-5B.

Figure 7A:
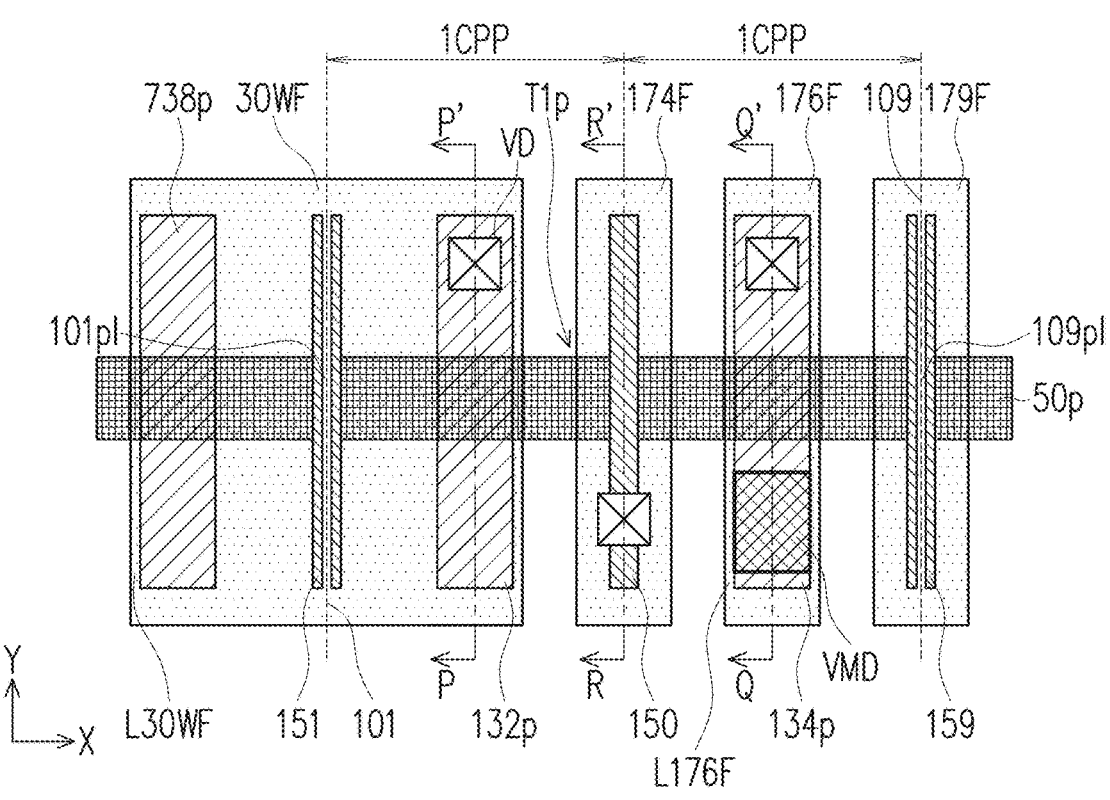
FIGS. 7A-7B are layout diagrams of an inverter circuit, in accordance with some embodiments.
Figure 7B:
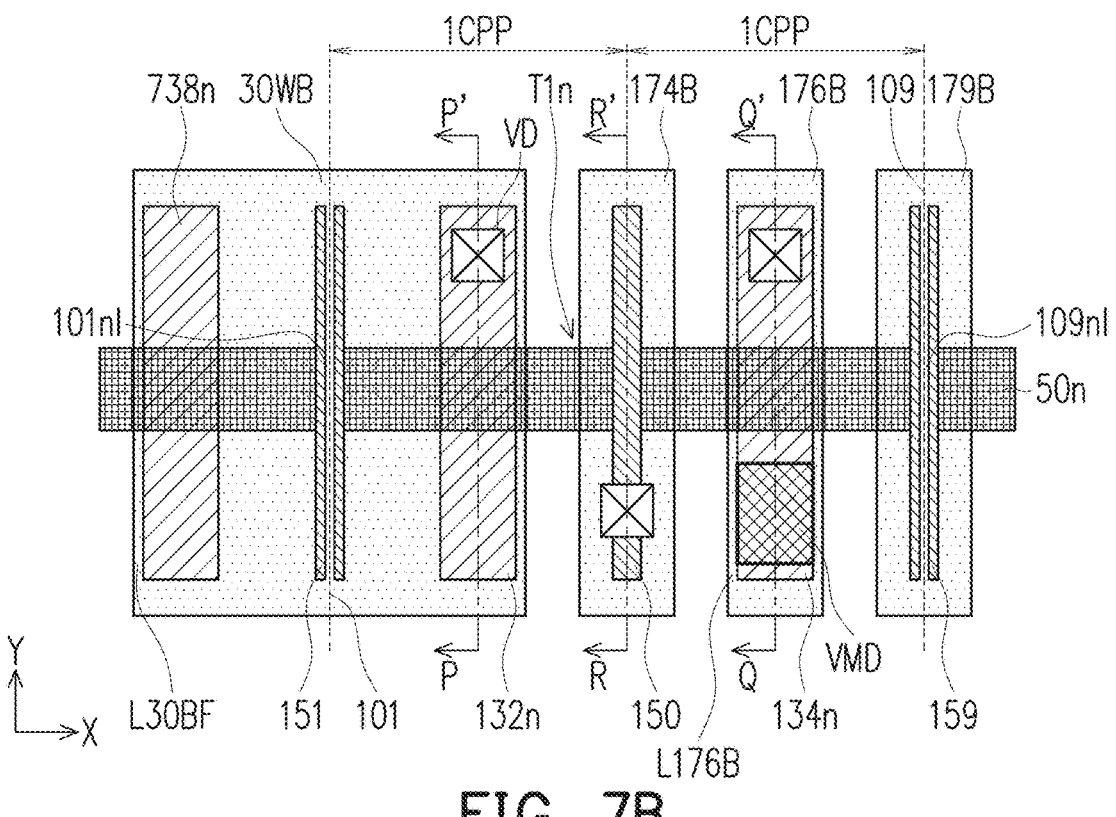

The layout diagrams in FIGS. 7A-7B are modified from the layout diagrams in FIGS. 5A-5B. The modification includes adding conductive segments 738*p* and 738*n* in a neighboring circuit cell adjacent to the vertical cell boundary 101. The conductive segment 738*p*, extending in the Y-direction, intersects the p-type active-region semiconductor structure 50*p* at a source region or a drain region of a PMOS transistor in the neighboring circuit cell. The conductive segment 738*n*, extending in the Y-direction, intersects the n-type active-region semiconductor structure 50*n* at a source region or a drain region of an NMOS transistor in the neighboring circuit cell. In addition, in FIG. 7A, the front-side signal lines 171F and the front-side power rail 30F in FIG. 5A is merged as a wide front-side power rail 30WF in the front-side conductive layer, and the wide front-side power rail 30WF is further widened to occupy the area that is above the conductive segment 738*p*. In FIG. 7B, the back-side signal lines 171B and the back-side power rail 30B in FIG. 5B is merged as a wide back-side power rail 30WB in the back-side conductive layer, and the wide back-side power rail 30WB is further widened to occupy the area that is below the conductive segment 738*n*.

In some specific implementations, the edge-to-edge distance (such as, the distance from edge L30WF to edge L176F) between the wide front-side power rail 30WF and the front-side signal line 176F is 2 CPP. In addition, the edge-to-edge distance (such as, the distance from edge L30WB to edge L176B) between the wide back-side power rail 30WB and the back-side signal line 176B is also 2 CPP. The wide power rails (such as 30WF and 30WB) in FIGS. 7A-7B have reduced IR drops, as compared with the corresponding power rails (such as 30F and 30B) in FIGS. 5A-5B or compared with the corresponding widened power rails (such as 30MF and 30MB) in FIGS. 6A-6B.

In each of the layout diagrams of FIGS. 5A-5B, FIGS. 6A-6B, and FIGS. 7A-7B, only one front-side power rail or only one back-side power rail is depicted. In each of the layout diagrams of FIGS. 8A-8C, an array of power rails in the front-side conductive layer or in the back-side conductive layer is depicted.

Figure 8B:
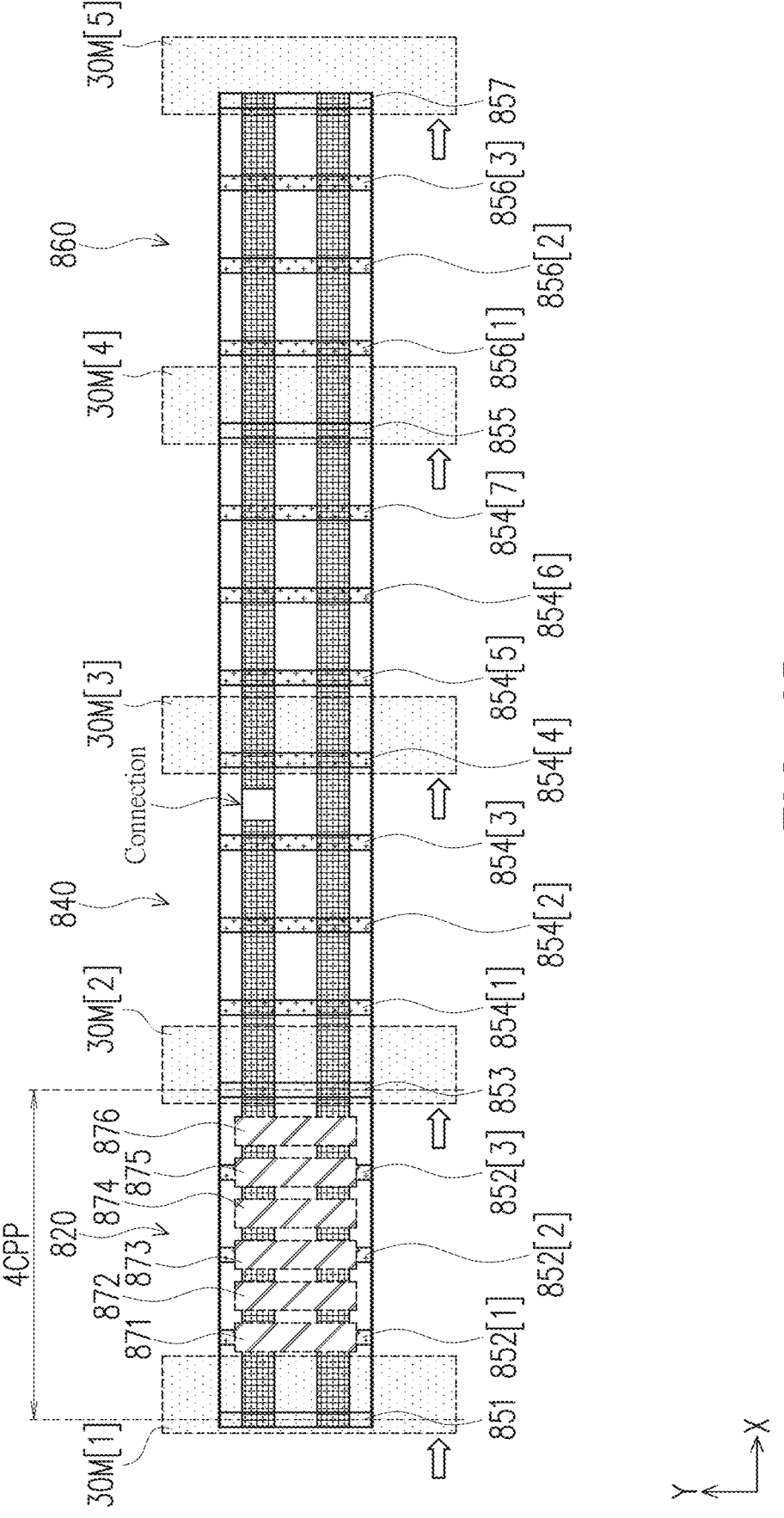
Figure 8C:
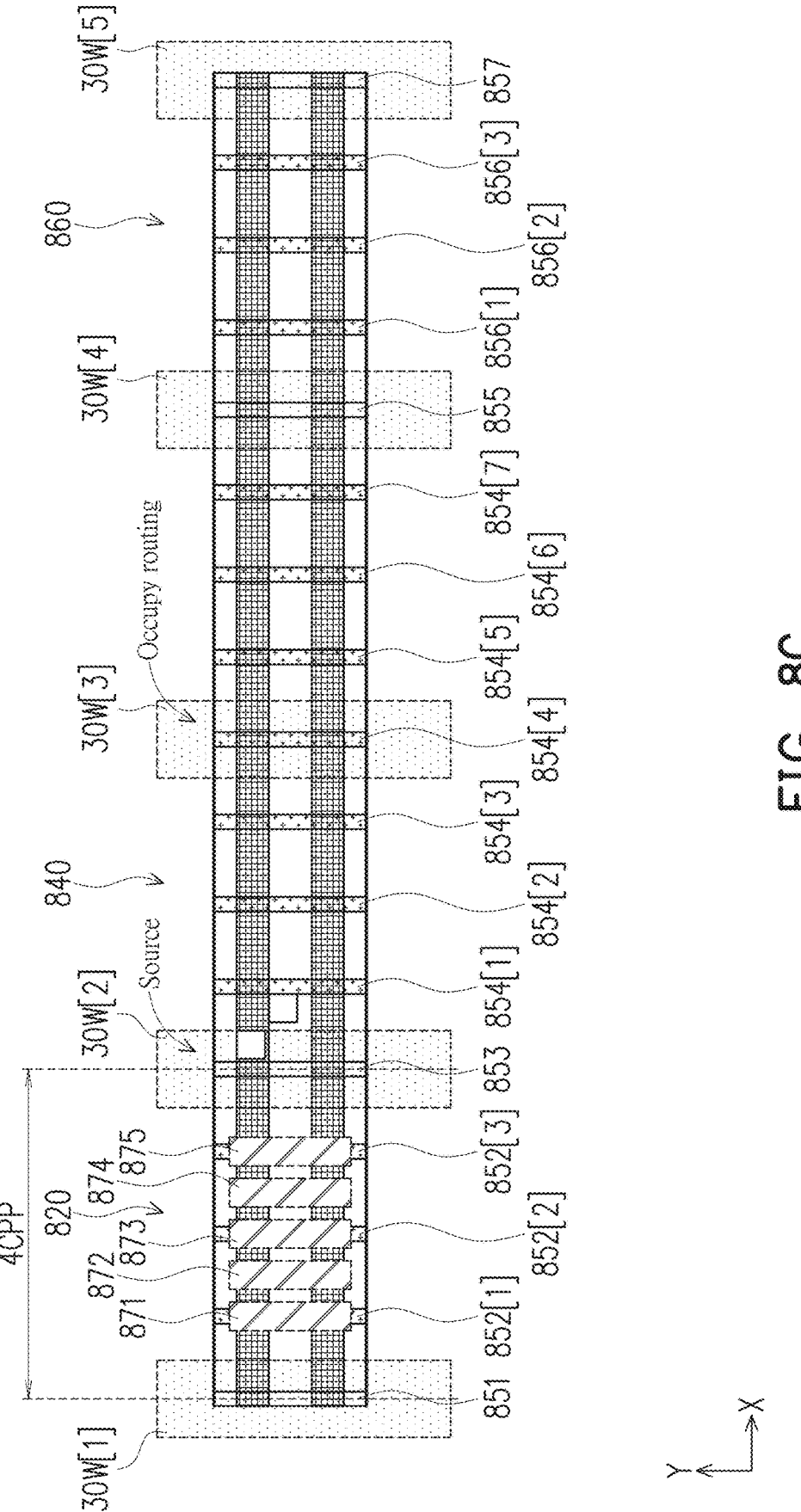

In each of the layout diagrams of FIGS. 8A-8C, three circuit cells 820, 840, and 860 area arranged as a row of circuit cells. The circuit cell 820 includes three gate-conductors 852[1], 852[2], and 852[3] between dummy gate-conductors 851 and 853. The circuit cell 840 includes seven gate-conductors 854[1]-854[7] between dummy gate-conductors 853 and 855. The circuit cell 860 includes three gate-conductors 856[1]-856[3] between dummy gate-conductors 855 and 857. Each of the vertical cell boundaries of the circuit cells 820, 840, and 860 is aligned with a corresponding dummy gate-conductor. For example, the two vertical cell boundaries of the circuit cell 820 are correspondingly aligned with the dummy gate-conductors 851 and 853, the two vertical cell boundaries of the circuit cell 840 are correspondingly aligned with the dummy gate-conductors 853 and 855, and the two vertical cell boundaries of the circuit cell 860 are correspondingly aligned with the dummy gate-conductors 855 and 857.

In FIG. 8A, an array of power rails extending in the Y-direction is implemented and configured to provide the power supply voltages for the circuit cells 820, 840, and 860. The array of power rails includes power rails 30[1], 30[2], 30[3], 30[4], and 30[5]. In the example implementation as shown in FIG. 8A, the pitch distance between two neighboring power rails is four CPP. Other values of the pitch distance between two neighboring power rails are within contemplated scope of the present disclosure. For example, in some embodiments, the pitch distance between two neighboring power rails is large than four CPPs.

In FIG. 8A, signal lines extending in the Y-direction are implemented between the power rails. For example, seven signal lines 871-877 are implemented between the power rails 30[1] and 30[2]. Each of the seven signal lines 871-877 occupies one conducting line tracks that are equally spaced. The signal lines between other power rails in FIG. 8A are not explicitly depicted in the figures. In the example implementation as shown in FIG. 8A, the pitch distance between two signal lines is 0.5 CPP. Other values of the pitch distance between two neighboring signal lines are within contemplated scope of the present disclosure.

In FIG. 8A, each of the signal lines occupies one vertical routing track. Each of the power rails also occupies one vertical routing track. In some embodiments, the pitch distance between two vertical routing tracks is selected based on IR drop and electromigration requirements. Increasing the pitch distance between two vertical routing tracks results in wider power rails and wider vertical signal lines, which reduces IR drop and electromigration in the circuits. Decreasing the pitch distance between two vertical routing tracks results in narrower power rails and wider vertical signal lines, which increases signal routing flexibility in the circuits but increase IR drop in the power rails.

In FIG. 8A, when the power rails 30[1]-30[5] as specified by the layout diagram are implemented in a front-side conductive layer, each of the power rails 30[1]-30[5] in FIG. 8A represents a front-side power rail, and each of the signal lines represents a front-side signal line which occupies one of the multiple front-side conducting line tracks. The power rails 30[1] and 30[2] are two adjacent front-side power rails. When the power rails 30[1]-30[5] as specified by the layout diagram are implemented in a back-side conductive layer, each of the power rails 30[1]-30[5] in FIG. 8A represents a back-side power rail, and each of the signal lines represents a back-side signal line which occupies one of the multiple back-side conducting line tracks. The power rails 30[1] and 30[2] are two adjacent back-side power rails.

The layout diagram in FIG. 8B is modified from the layout diagram in FIG. 8A. The modification includes substituting the power rails 30[1]-30[5] in FIG. 8A correspondingly with widened power rails 30M[1]-30M[5] in FIG. 8B. Additionally, one of the signal lines which is adjacent to each widened power rail in FIG. 8B is removed, to accommodate the implementation in which each widened power rail in FIG. 8B occupies two vertical routing tracks. For example, the signal line 877 in FIG. 8A is absence in FIG. 8B, because widened power rails 30M[2] also occupies the vertical routing which is used to implement the signal line 877 in FIG. 8A. The IR drops in the widened power rails 30M[1]-30M[5] of FIG. 8B are smaller than that in the power rails 30[1]-30[5] of FIG. 8A.

In FIG. 8B, when the widened power rails 30M[1]-30M[5] as specified by the layout diagram are implemented in a front-side conductive layer, each of the widened power rails 30M[1]-30M[5] in FIG. 8B represents a front-side power rail, and each of the signal lines represents a front-side signal line. When the widened power rails 30M[1]-30M[5] as specified by the layout diagram are implemented in a back-side conductive layer, each of the widened power rails 30M[1]-30M[5] in FIG. 8B represents a back-side power rail, and each of the signal lines represents a back-side signal line.

The layout diagram in FIG. 8C is modified from the layout diagram in FIG. 8A. The modification includes substituting the power rails 30[1]-30[5] in FIG. 8A correspondingly with wide power rails 30W[1]-30W[5] in FIG. 8C. Additionally, because each wide power rail in FIG. 8C occupies three vertical routing tracks, some signal lines adjacent to the wide power rails 30W[1]-30W[5] are removed. For example, the signal lines 876-877 in FIG. 8A are removed for the wide rail 30W[2] (which now occupies the vertical routings used to implement the signal lines 876-877 in FIG. 8A). The IR drops in the wide power rails 30W[1]-30W[5] of FIG. 8C are smaller than the IR drops in the power rails 30[1]-30[5] of FIG. 8A or the IR drops in the power rails 30M[1]-30M[5] of FIG. 8B.

In FIG. 8C, when the wide power rails 30W[1]-30W[5] as specified by the layout diagram are implemented in a front-side conductive layer, each of the wide power rails 30W[1]-30W[5] of FIG. 8C represents a front-side power rail, and each of the signal lines represents a front-side signal line. When the wide power rails 30W[1]-30W[5] as specified by the layout diagram are implemented in a back-side conductive layer, each of the wide power rails 30W[1]-30W [5] of FIG. 8C in FIG. 8B represents a back-side power rail, and each of the signal lines represents a back-side signal line.

The layout diagrams in FIGS. 8A-8C, the power rails are depicted extending in the Y-direction and passing across a row of circuit cells. When the power rails as described in this disclosure are implemented in an integrated circuit, the power rails often pass across multiple rows of circuit cells.

Figure 9:
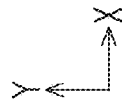
FIG. 9 is a layout diagram of an integrated circuit having multiple rows of circuit cells, in accordance with some embodiments.

FIG. 9 is a layout diagram of an integrated circuit having multiple rows of circuit cells, in accordance with some embodiments. The integrated circuit 900 in FIG. 9 includes five rows 910[1]-910[5] of circuit cells, and each of the five rows 910[1]-910[5] is formed with multiple circuit cells arranged along the X-direction. In FIG. 9, an array of power rails (with each power rail extending in the Y-direction) is implemented and configured to provide the power supply voltages for at least the circuit cells in the five rows 910[1]-910[5]. The array of power rails includes power rails 30[1], 30[2], 30[3], 30[4], 30[5], and 30[6]. In FIG. 8A, when the power rails 30[1]-30[6] as specified by the layout diagram are implemented in a front-side conductive layer, each of the power rails 30[1]-30[6] in FIG. 9 represents a front-side power rail. When the power rails 30[1]-30[6] as specified by the layout diagram are implemented in a back-side conductive layer, each of the power rails 30[1]-30[6] in FIG. 9 represents a back-side power rail.

Various example layout designs of circuit cells configured to be powered by vertical power rails (such as the array of power rails in FIG. 9) are described in this disclosure. The example layout designs of circuit cells implemented with CFET transistors are depicted in FIGS. 10A-10B, FIGS. 11A-11B, FIGS. 12A-12B, FIGS. 13A-13B, FIGS. 14A-14B, and FIGS. 15A-15B.

Figure 10A:
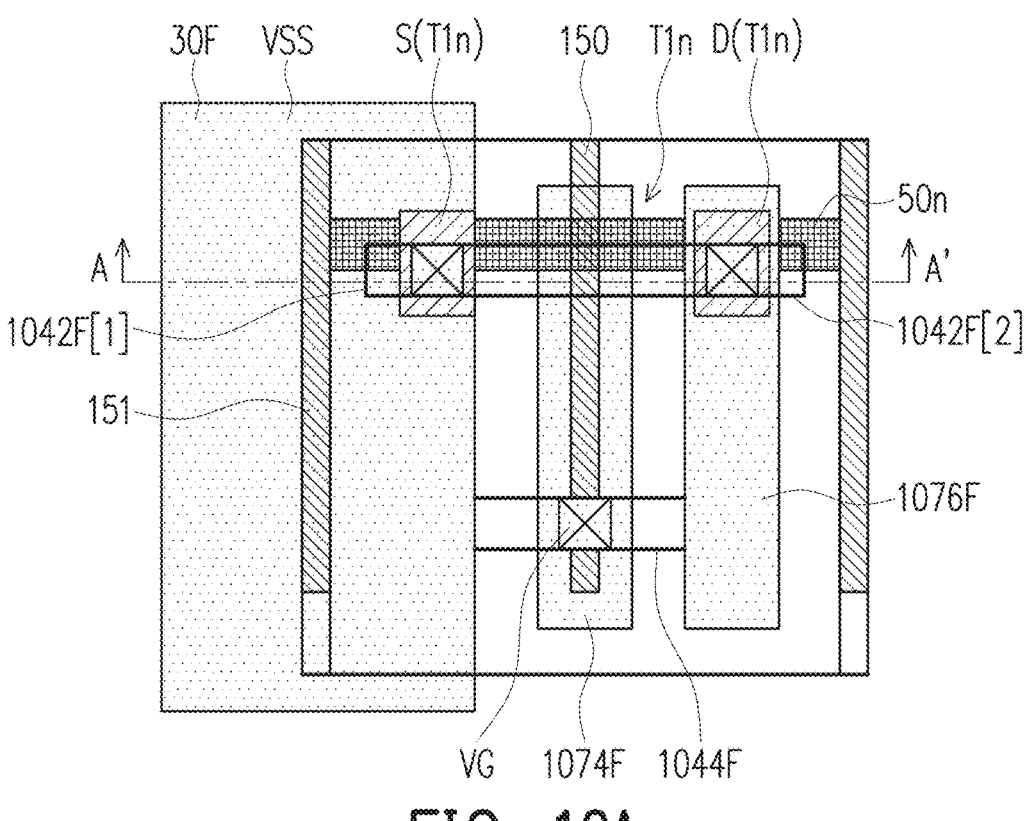
FIGS. 10A-10B are layout diagrams of an inverter circuit, in accordance with some embodiments.
Figure 10B:
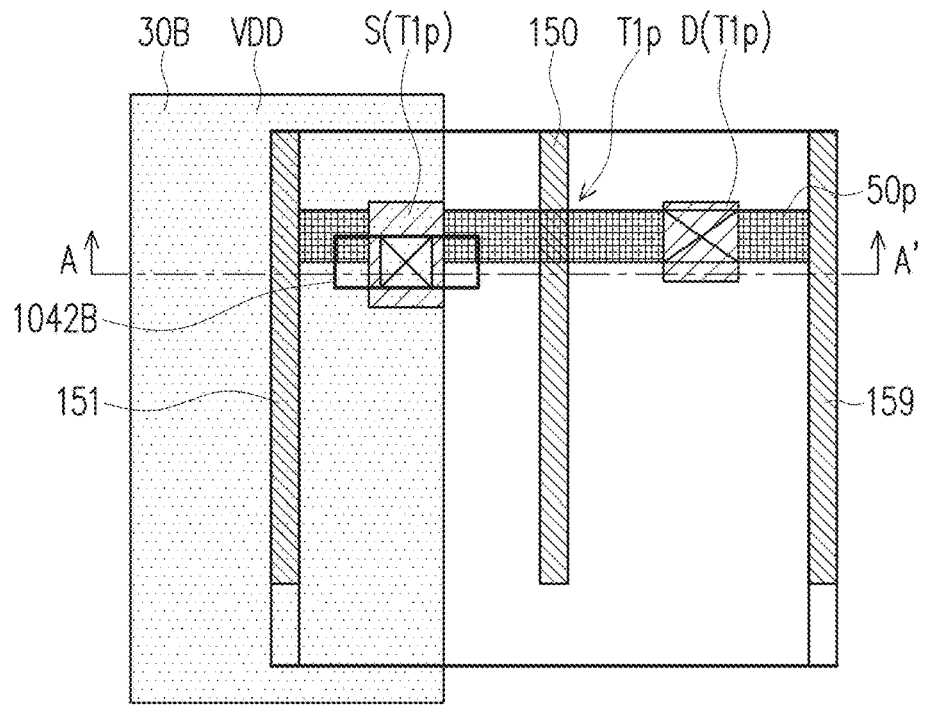
Figure 10C:
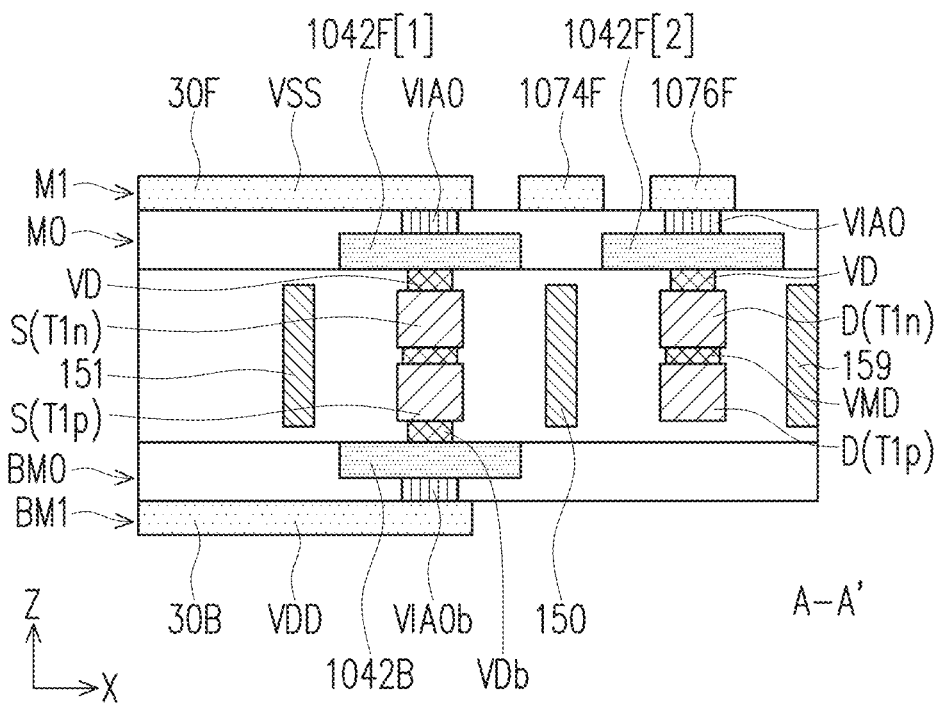
FIG. 10C is a cross-sectional view of the inverter circuit in a cutting plane as specified by the layout diagrams of FIGS. 10A-10B, in accordance with some embodiments.

FIGS. 10A-10B are layout diagrams of an inverter circuit, in accordance with some embodiments. In FIGS. 10A-10B, adjacent gate-conductors are separated by a pitch distance of one CPP. FIG. 10C is a cross-sectional view of the inverter circuit in the cutting plane as specified by the line A-A' in the layout diagrams of FIGS. 10A-10B, in accordance with some embodiments.

In FIGS. 10A-10C, the inverter circuit is configured to be powered by a front-side power rail 30F and a back-side power rail 30B. Each of the front-side power rail 30F and the back-side power rail 30B extends in the Y-direction. Each of the front-side power rail 30F and the back-side power rail 30B extends in the Y-direction. Front-side horizontal conducting lines 1042F[1]-1042F[2] and 1044F extending in the X-direction are fabricated in a first front-side conductive layer (e.g., a metal layer M0), and a back-side horizontal conducting line 1042B extending in the X-direction is fabricated in a first back-side conductive layer (e.g., a metal layer BM0). The front-side power rail 30F is fabricated in a second front-side conductive layer (e.g., a metal layer M1), and the back-side power rail 30B is fabricated in a second back-side conductive layer (e.g., a metal layer BM1). The front-side signal lines 1074F and 1076F extending in the Y-direction are also fabricated in the second front-side conductive layer (e.g., the metal layer M1). The second front-side conductive layer is above the first front-side conductive layer, while the second back-side conductive layer is below the first back-side conductive layer.

The inverter circuit includes a PMOS transistor T1$p$ in a p-type active-region semiconductor structure 50$p$ and an NMOS transistor T1$n$ in a n-type active-region semiconductor structure 50$n$. The source terminal S(T1$p$) of the PMOS transistor T1$p$ is connected to the back-side horizontal conducting line 1042B through a back-side via connector VDb, and the back-side horizontal conducting line 1042B is further connected to the back-side power rail 30B through a back-side via connector VIA0$b$. The source terminal S(T1$n$) of the NMOS transistor T1$p$ is connected to the front-side horizontal conducting line 1042F[1] through a front-side via connector VD, and the front-side horizontal conducting line 1042F[1] is further connected to the front-side power rail 30F through a front-side via connector VIA0. The drain terminal D(T1$p$) of the PMOS transistor T1$p$ and the drain terminal D(Tn) of the NMOS transistor T1$n$ is connected together through a conductive-segment inter-connector VMD.

In FIGS. 10A-10C, the inverter circuit is in a circuit cell bounded by vertical cell boundaries aligned with dummy gate-conductors 151 and 159. The gate-conductor 150 is connected to both the gate terminal of the PMOS transistor T1$p$ and the gate terminal of the NMOS transistor T1$n$. The gate-conductor 150 is connected to the front-side horizontal conducting line 1044F through a front-side via connector VG, and the front-side horizontal conducting line 1044F is further connected to the front-side signal line 1074F through a front-side via connector VIA0. The drain terminal D(T1$n$) of the NMOS transistor T1$n$ is connected to the front-side horizontal conducting line 1042F[2] through a front-side via connector VD, and the front-side horizontal conducting line 1042F[2] is further connected to the front-side signal line 1076F through a front-side via connector VIA0. The front-side signal line 1074F is configured to carry an input signal of the inverter circuit, and the front-side signal line 1076F is configured to carry an output signal of the inverter circuit.

In FIGS. 10A-10C, an active-region semiconductor structure stack is formed by the p-type active-region semiconductor structure 50$p$ and the n-type active-region semiconductor structure 50$n$. The active-region semiconductor structure stack in the inverter circuit of FIGS. 10A-10C is different from that in the inverter circuit of FIGS. 2A-2B and 3A-3C. In FIGS. 10A-10C, the n-type active-region semiconductor structure 50$n$ is above the p-type active-region semiconductor structure 50$p$. In FIGS. 2A-2B and 3A-3C, as a comparison, the n-type active-region semiconductor structure 50$n$ is below the p-type active-region semiconductor structure 50$p$. That is, in FIGS. 10A-10C, the first front-side conductive layer is more proximate to the n-type active-region semiconductor structure 50$n$ than to the p-type active-region semiconductor structure 50$p$. In FIGS. 2A-2B and 3A-3C, as a comparison, the first front-side conductive layer is more proximate to the p-type active-region semiconductor structure 50$p$ than to the n-type active-region semiconductor structure 50$n$.

In the circuit cells as specified by the layout diagrams in FIGS. 10A-10B, FIGS. 11A-11B, FIGS. 12A-12B. FIGS. 13A-13B, FIGS. 14A-14B, and FIGS. 15A-15B, each active-region semiconductor structure stack includes an n-type active-region semiconductor structure above a p-type active-region semiconductor structure. In alternative implementations, each active-region semiconductor structure stack includes an n-type active-region semiconductor structure below a p-type active-region semiconductor structure. Various variations of the circuit cells based on alternative implementations of active-region semiconductor structure stacks are all within the contemplated scope of the present disclosure.

Figure 11A:
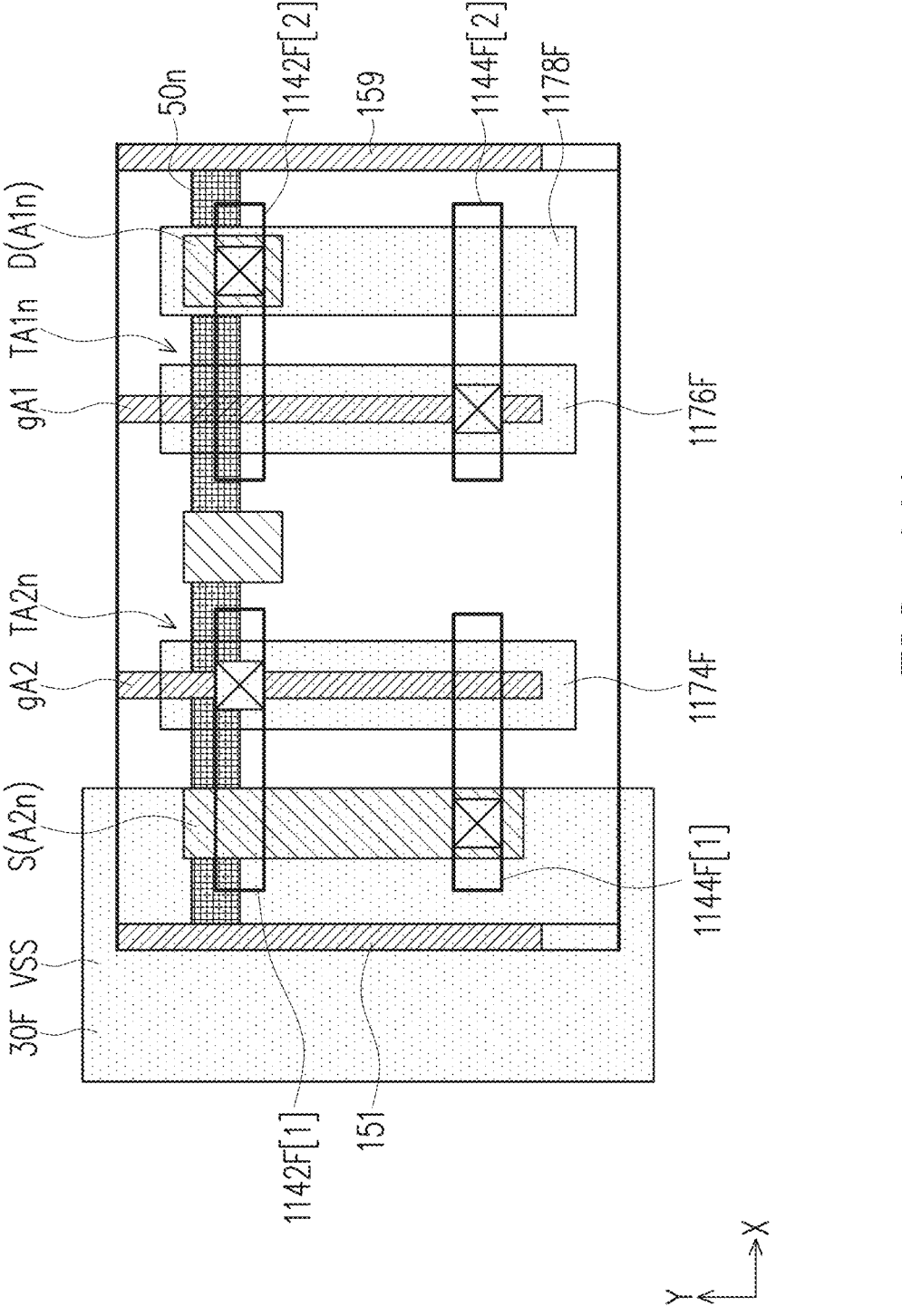
FIGS. 11A-11B are layout diagrams of a NAND circuit, in accordance with some embodiments.
Figure 11B:

FIGS. 11A-11B are layout diagrams of a NAND circuit, in accordance with some embodiments. The NAND circuit is configured to be powered by a front-side power rail 30F and a back-side power rail 30B. Each of the front-side power rail 30F and the back-side power rail 30B extends in the Y-direction. Front-side horizontal conducting lines 1142F[1]-1142F[2] and 1144F[1]-1144F[2] extending in the X-direction are fabricated in a first front-side conductive layer (e.g., a metal layer M0), and back-side horizontal conducting lines 1142B and 1144B extending in the X-direction are fabricated in a first back-side conductive layer (e.g., a metal layer BM0). The front-side power rail 30F is fabricated in a second front-side conductive layer (e.g., a metal layer M1), and the back-side power rail 30B is fabricated in a second back-side conductive layer (e.g., a metal layer BM1). Front-side signal lines 1174F, 1176F, and 1178F extending in the Y-direction are also fabricated in the second front-side conductive layer (e.g., the metal layer M1). The second front-side conductive layer is above the first front-side conductive layer, while the second back-side conductive layer is below the first back-side conductive layer.

In FIGS. 11A-11B, the NAND circuit is in a circuit cell bounded by vertical cell boundaries aligned with dummy gate-conductors 151 and 159. The gate-conductor gA1 is connected to both the gate terminal of the PMOS transistor TA1$p$ and the gate terminal of the NMOS transistor TA1$n$. The gate-conductor gA2 is connected to both the gate terminal of the PMOS transistor TA2$p$ and the gate terminal of the NMOS transistor TA2$n$. The PMOS transistors TA1$p$ and TA2$p$ are in a p-type active-region semiconductor structure 50$p$, and the NMOS transistors TA1$n$ and TA2$n$ are in an n-type active-region semiconductor structure 50$n$.

In FIG. 11B, the joint source terminal S(A1$p$, A2$p$) of the PMOS transistors TA1$p$ and TA2$p$ is connected to the back-side horizontal conducting line 1144B, while the back-side horizontal conducting line 1144B is connected to the back-side power rail 30B through a back-side via connector VIA0$b$ between the second back-side conductive layer and the first back-side conductive layer. The drain terminal D(A1$p$) of the PMOS transistor TA1$p$ and the drain terminal D(A2$p$) of the PMOS transistor TA2$p$ are connected to the back-side horizontal conducting line 1142B. The drain terminal D(A1$p$) of the PMOS transistor TA1$p$ is also connected to the drain terminal D(A1$n$) of the NMOS transistor TA1$n$ (in FIG. 11A) through a conductive-segment interconnector VMD.

In FIG. 11A, the source terminal S(A1$n$) of the NMOS transistor TA1$n$ and the drain terminal D(A2$n$) of the NMOS transistor TA2$n$ are joined together in the n-type active-region semiconductor structure 50$n$ at the region between gate-conductors gA1 and gA2. The source terminal S(A2$n$) of the NMOS transistor TA2$n$ is connected to the front-side power rail 30F through a front-side via connector VD.

The front-side power rail 30F is connected to the front-side horizontal conducting line 1144F[1] through a front-side via connector VIA0, and the back-side power rail 30B is connected to the back-side horizontal conducting line 1144B through a back-side via connector VIA0$b$. The gate-conductor gA1 is connected to the front-side horizontal conducting line 1144F[2] which is further connected to the front-side signal lines 1176F. The gate-conductor gA2 is connected to the front-side horizontal conducting line 1142F [1] which is further connected to the front-side signal lines 1174F. The drain terminal D(A1$n$) of the NMOS transistor TA1$n$ is connected to the front-side horizontal conducting line 1142F[2] which is further connected to the front-side signal lines 1178F. The front-side signal lines 1176F is configured to carry the first input signal "A1" of the NAND circuit, the front-the front-side signal lines 1174F is configured to carry the second input signal "A2" of the NAND circuit, and the front-side signal lines 1178F is configured to carry the output signal "Z" of the NAND circuit.

Figure 12A:
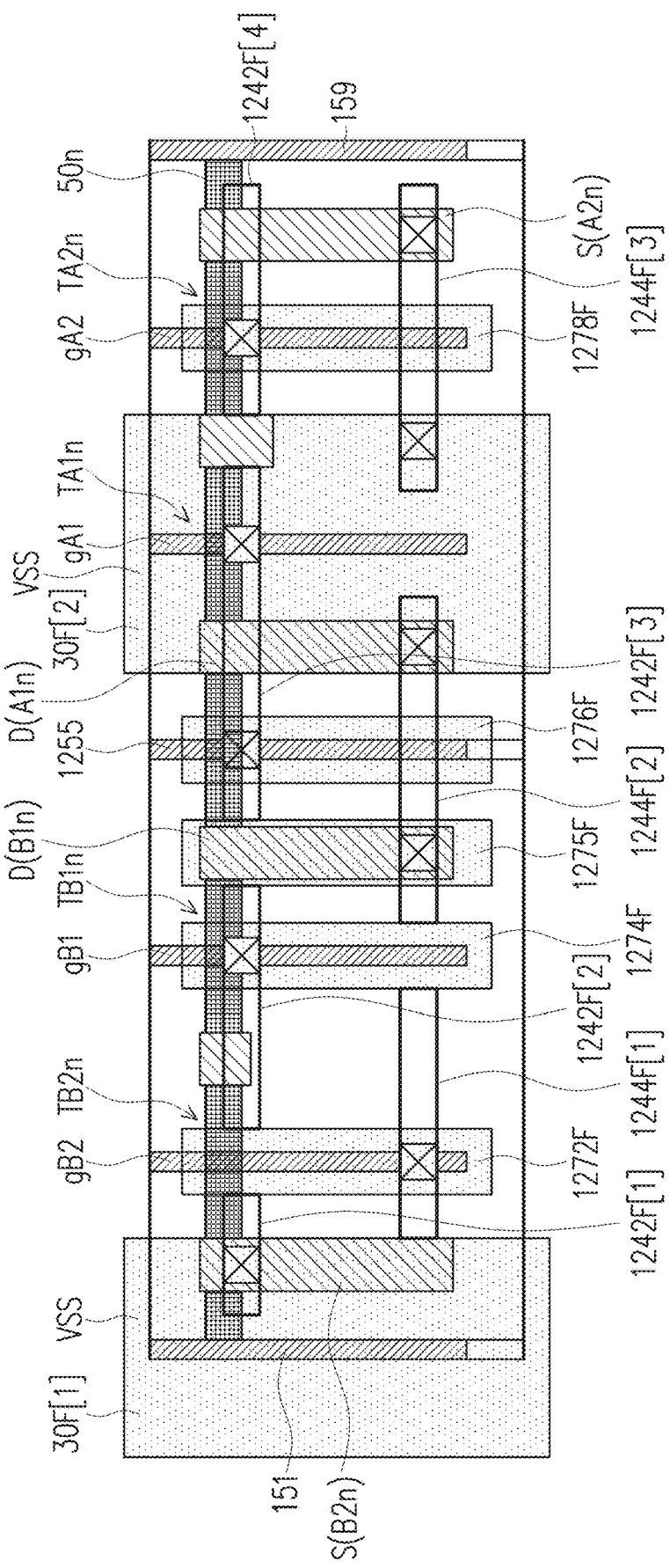
FIGS. 12A-12B are layout diagrams of an AND-OR-Inverter ("AOI") circuit, in accordance with some embodiments.
Figure 12B:
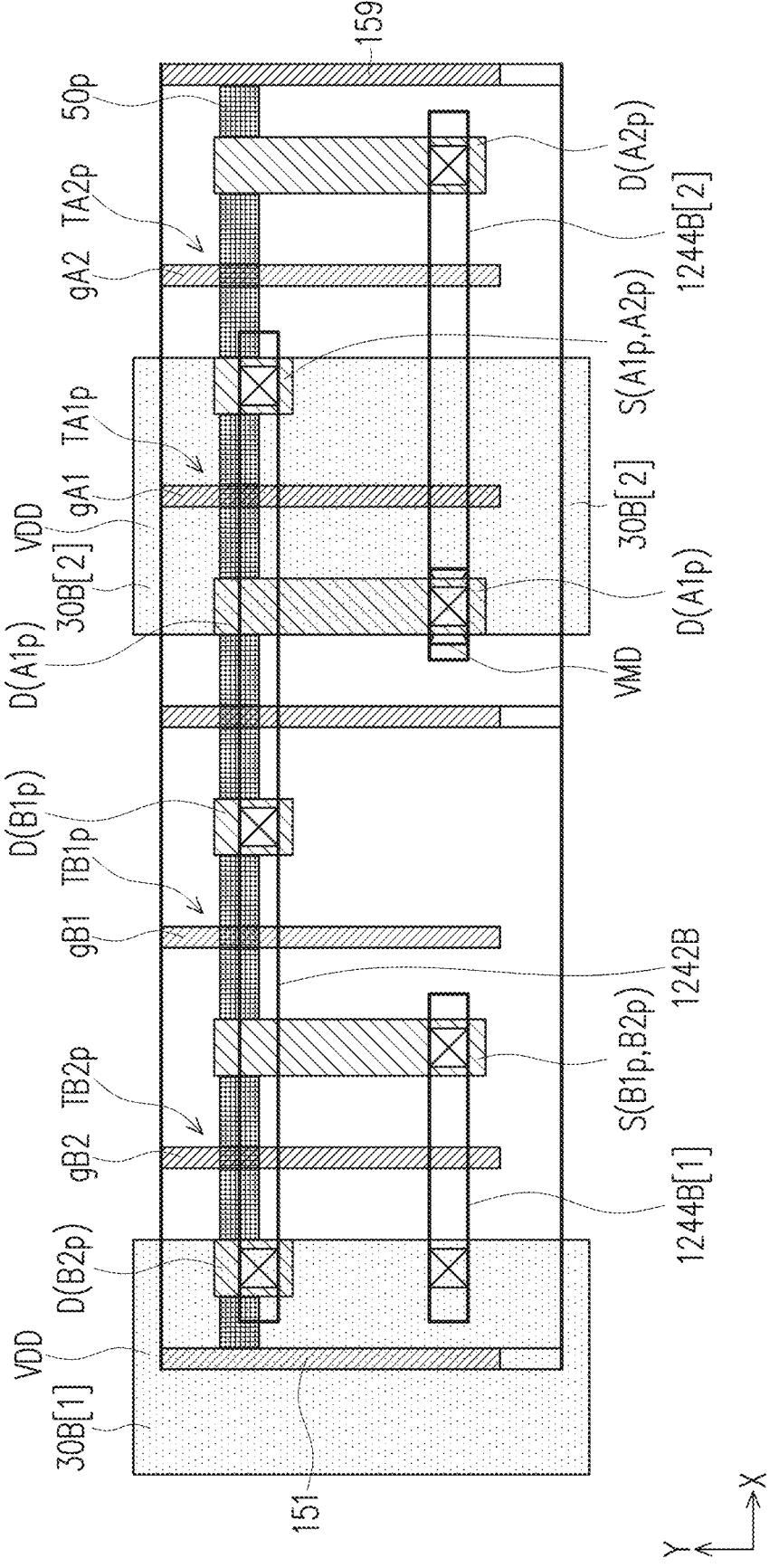

FIGS. 12A-12B are layout diagrams of an AND-OR-Inverter ("AOI") circuit, in accordance with some embodiments. The AOI circuit is configured to be powered by front-side power rails 30F[1]-30F[2] and back-side power rails 30B[1]-30B[2]. Each of the front-side power rails 30F[1]-30F[2] and the back-side power rails 30B[1]-30B[2] extends in the Y-direction. Front-side horizontal conducting lines 1242F[1]-1242F[4] and 1244F[1]-1244F[3] extending in the X-direction are fabricated in a first front-side conductive layer (e.g., a metal layer M0), and back-side horizontal conducting lines 1242B and 1244B[1]-1244B[2] extending in the X-direction are fabricated in a first back-side conductive layer (e.g., a metal layer BM0). The front-side power rails 30F[1]-30F[2] are fabricated in a second front-side conductive layer (e.g., a metal layer M1), and the back-side power rails 30B[1]-30B[2] are fabricated in a second back-side conductive layer (e.g., a metal layer BM1). Front-side signal lines 1272F, 1274F, 1275, 1276F, and 1278F extending in the Y-direction are also fabricated in the second front-side conductive layer (e.g., the metal layer M1). The second front-side conductive layer is above the first front-side conductive layer, while the second back-side conductive layer is below the first back-side conductive layer.

In FIGS. 12A-12B, the AOI circuit is in a circuit cell bounded by vertical cell boundaries aligned with dummy gate-conductors 151 and 159. The AOI circuit includes gate-conductors gA1, gA2, gB1, and gB2 extending in the Y-direction and another dummy gate-conductor 1255 between the gate-conductors gB1 an dgA1. The gate-conductor gA1 is connected to both the gate terminal of the PMOS transistor TA1$p$ and the gate terminal of the NMOS transistor TA1$n$. The gate-conductor gA2 is connected to both the gate terminal of the PMOS transistor TA2$p$ and the gate terminal of the NMOS transistor TA2$n$. The gate-conductor gB1 is connected to both the gate terminal of the PMOS transistor TB1$p$ and the gate terminal of the NMOS transistor TB1$n$. The gate-conductor gB2 is connected to both the gate terminal of the PMOS transistor TB2$p$ and the gate terminal of the NMOS transistor TB2$n$. The PMOS transistors TA1$p$, TA2$p$, TB1$p$, and TB2$p$ are in the p-type active-region semiconductor structure 50$p$, and the NMOS transistors TA1$n$, TA2$n$, TB1$n$, and TB2$n$ are in the n-type active-region semiconductor structure 50$n$.

In FIG. 12B, the joint source terminal S(B1$p$, B2$p$) of the PMOS transistors TB1$p$ and TB2$p$ is connected to the back-side horizontal conducting line 1244B[1] which is further connected to the back-side power rail 30B[1] (through a back-side via connector VIA0$b$ between the first back-side conductive layer and the second back-side conductive layer). The drain terminal D(B1$p$) of the PMOS transistor TB1$p$ and the drain terminal D(B2$p$) of the PMOS transistor TB2$p$ are connected to the back-side horizontal conducting line 1242B. The back-side horizontal conducting line 1242B is also connected to the joint source terminal S(A1$p$, A2$p$) of the PMOS transistors TA1$p$ and TA2$p$. The drain terminal D(A1$p$) of the PMOS transistor TA1$p$ and the drain terminal D(A2$p$) of the PMOS transistor TA2$p$ are connected to the back-side horizontal conducting line 1244B [2]. The drain terminal D(A1$p$) of the PMOS transistor TA1$p$ is also connected to the drain terminal D(A1$n$) of the NMOS transistor TA1$n$ (in FIG. 12A) through a conductive-segment inter-connector VMD.

In FIG. 12A, the drain terminal D(A1$n$) of the NMOS transistor TA1$n$ connected to the front-side horizontal conducting line 1244F[2] which is further connected to the drain terminal D(B1$n$) of the NMOS transistor TB1$n$. The source terminal S(A1$n$) of the NMOS transistor TA1$n$ and the drain terminal D(A2$n$) of the NMOS transistor TA2$n$ are joined together in the n-type active-region semiconductor structure 50$n$. The source terminal S(A2$n$) of the NMOS transistor TA2$n$ is connected to the front-side horizontal conducting line 1244[3] through a front-side via connector VD, and the front-side horizontal conducting line 1244F[3] is connected to the front-side power rail 30F[2] through a front-side via connector VIA0 between the first front-side conductive layer and the second front-side conductive layer.

The source terminal S(B1$n$) of the NMOS transistor TB1$n$ and the drain terminal D(B2$n$) of the NMOS transistor TB2$n$ are joined together in the n-type active-region semiconductor structure 50$n$. The source terminal S(B2$n$) of the NMOS transistor TB2$n$ is connected to the front-side horizontal conducting line 1242F[1] through a front-side via connector VD, and the front-side horizontal conducting line 1242F[1] is connected to the front-side power rail 30F[1] through a front-side via connector VIA0 between the first front-side conductive layer and the second front-side conductive layer.

The gate-conductor gA1 is connected to the front-side signal line 1242F[3] which is further connected to the front-side signal lines 1276F. The gate-conductor gA2 is connected to the front-side signal line 1242F[4] which is further connected to the front-side signal lines 1278F. The gate-conductor gB1 is connected to the front-side signal line 1242F[2] which is further connected to the front-side signal lines 1274F. The gate-conductor gB2 is connected to the front-side signal line 1244F[1] which is further connected to the front-side signal lines 1272F. The drain terminals of the NMOS transistors TA1$n$ and TB1$n$ is connected to the front-side signal line 1244F[2] which is further connected to the front-side signal lines 1275F. The front-side signal lines 1276F. 1278F, 1274F, and 1272F are configured to carry correspondingly the input signals "A1", "A2", "B1", and "B2" of the AOI circuit. The front-side signal line 1275F is configured to carry the output signal "Z" of the AOI circuit.

Figures 13A, 13B:
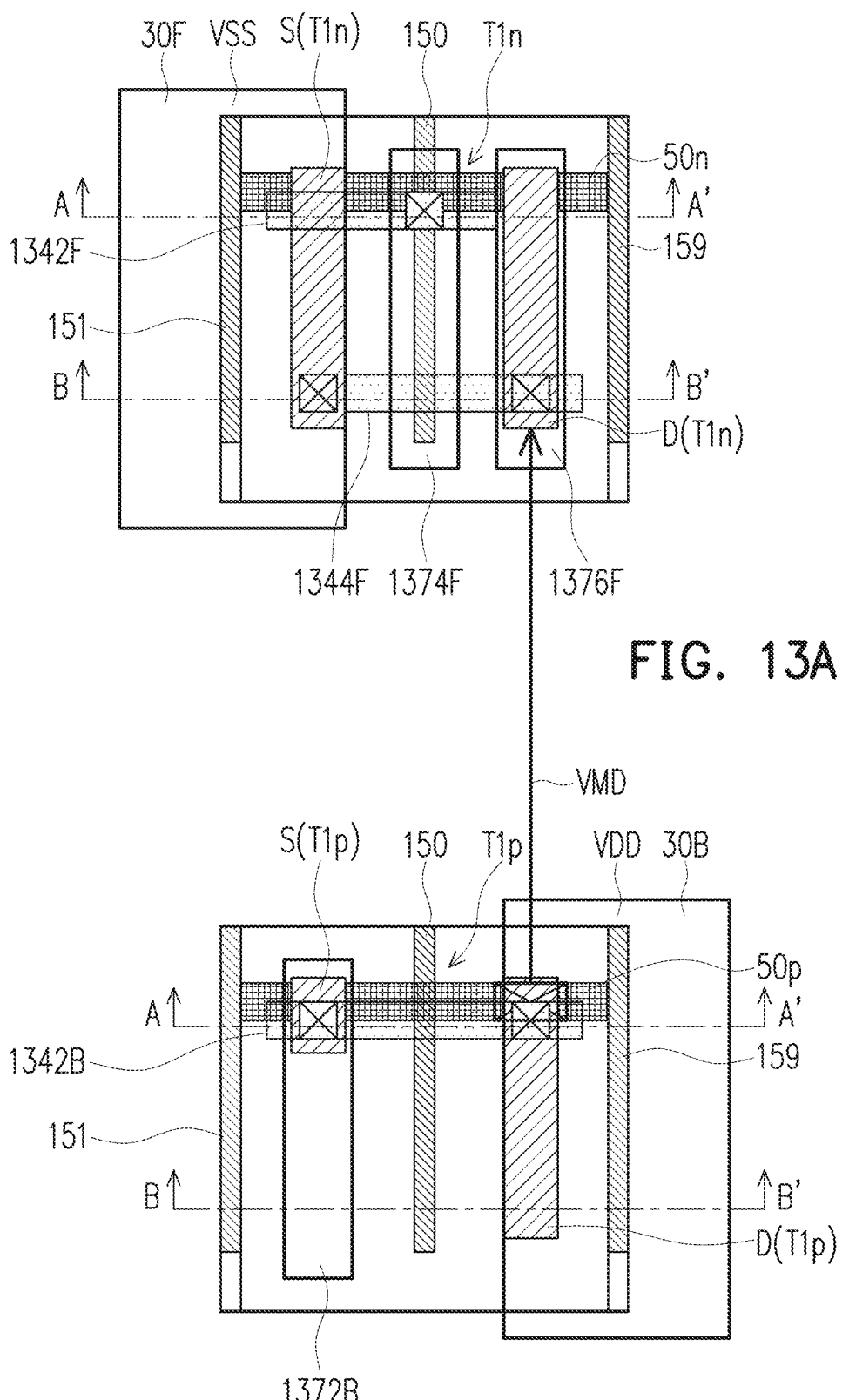
FIGS. 13A-13B are layout diagrams of an inverter circuit, in accordance with some embodiments.
Figure 13C:
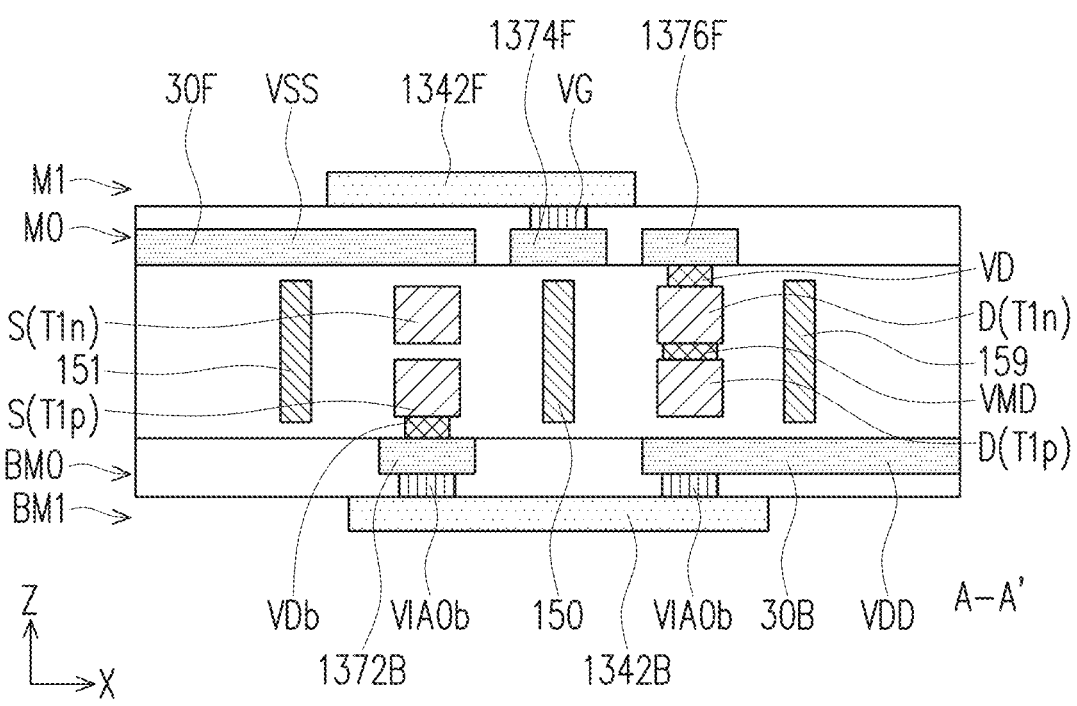
FIGS. 13C-13D are cross-sectional views of the inverter circuit of FIGS. 13A-13B, in accordance with some embodiments.
Figure 13D:
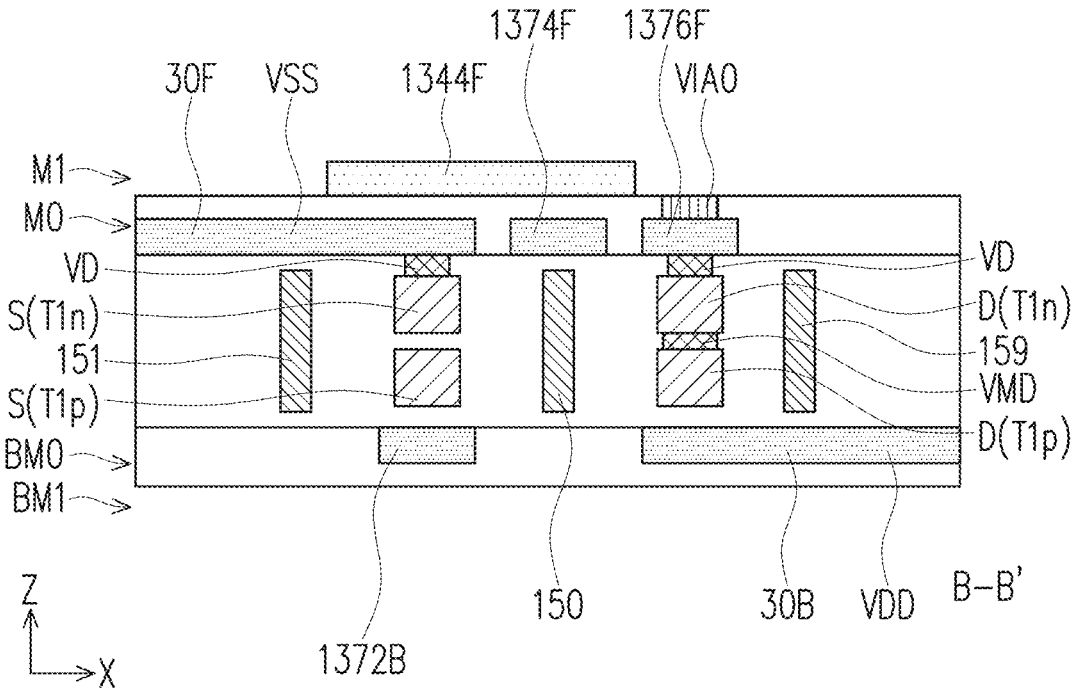

FIGS. 13A-13B are layout diagrams of an inverter circuit, in accordance with some embodiments. FIGS. 13C-13D are cross-sectional views of the inverter circuit of FIGS. 13A-13B correspondingly in cutting planes A-A' and B-B', in accordance with some embodiments. The inverter circuit is configured to be powered by a front-side power rail 30F and a back-side power rail 30B. Each of the front-side power rail 30F and the back-side power rail 30B extends in the Y-direction. The front-side power rail 30F is fabricated in a first front-side conductive layer (e.g., a metal layer M0), and the back-side power rail 30B is fabricated in a first back-side conductive layer (e.g., a metal layer BM0).

Front-side signal lines 1374F and 1376F extending in the Y-direction are also fabricated in the first front-side conductive layer (e.g., the metal layer M0). Back-side signal lines 1372B extending in the Y-direction are also fabricated in the first back-side conductive layer (e.g., the metal layer BM0).

Front-side horizontal conducting lines 1342F and 1344F extending in the X-direction are fabricated in a second front-side conductive layer (e.g., a metal layer M1), and back-side horizontal conducting lines 1342B extending in the X-direction are fabricated in a second back-side conductive layer (e.g., a metal layer BM1). The second front-side conductive layer is above the first front-side conductive layer, while the second back-side conductive layer is below the first back-side conductive layer.

In FIGS. 13A-13B, the inverter circuit is in a circuit cell bounded by vertical cell boundaries aligned with dummy gate-conductors 151 and 159. The gate-conductor 150 is connected to both the gate terminal of the PMOS transistor T1$p$ and the gate terminal of the NMOS transistor T1$n$. The PMOS transistor T1$p$ is in a p-type active-region semiconductor structure 50$p$, and the NMOS transistor T1$n$ is in an n-type active-region semiconductor structure 50$n$. The p-type active-region semiconductor structure 50$p$ is below the n-type active-region semiconductor structure 50$n$, thereby forming a stack of active-region semiconductor structures.

As shown in FIGS. 13B and FIGS. 13C-13D, the source terminal S(T1$p$) of the PMOS transistors T1$p$ is connected to the back-side signal line 1372B which is further connected to the back-side horizontal conducting line 1342B through a back-side via connector VIA0$b$, while he back-side horizontal conducting line 1342B is connected to the back-side power rail 30B through another back-side via connector VIA0$b$. Consequently, the source terminal of the PMOS transistor T1$p$ is configured receive the upper supply voltage VDD from the back-side power rail 30B. The drain terminal D(T1$p$) of the PMOS transistor T1$p$ is connected to the drain terminal D(T1$n$) of the NMOS transistor TA1$n$ (which is in FIG. 13A) through a conductive-segment inter-connector VMD. In FIGS. 13A, the source terminal S(T1$n$) of the NMOS transistor T1$n$ is connected to the front-side power rail 30F through a front-side via connector VD. Consequently, the source terminal S(T1$n$) of the NMOS transistor T1$n$ is configured receive the lower supply voltage VSS from the front-side power rail 30F.

As shown in FIGS. 13A and FIGS. 13C-13D, the gate-conductor 150 is connected to the front-side signal lines 1374F which is further connected to the front-side horizontal conducting line 1342F. The drain terminal D(A1$n$) of the NMOS transistor T1$n$ is connected to the front-side signal lines 1376F which is further connected to the front-side horizontal conducting line 1344F. The front-side horizontal conducting line 1342F is configured to carry correspondingly the input signals "I" of the inverter circuit. The front-side horizontal conducting line 1344F is configured to carry the output signal "Z" of the inverter circuit.

Figures 14A, 14B:
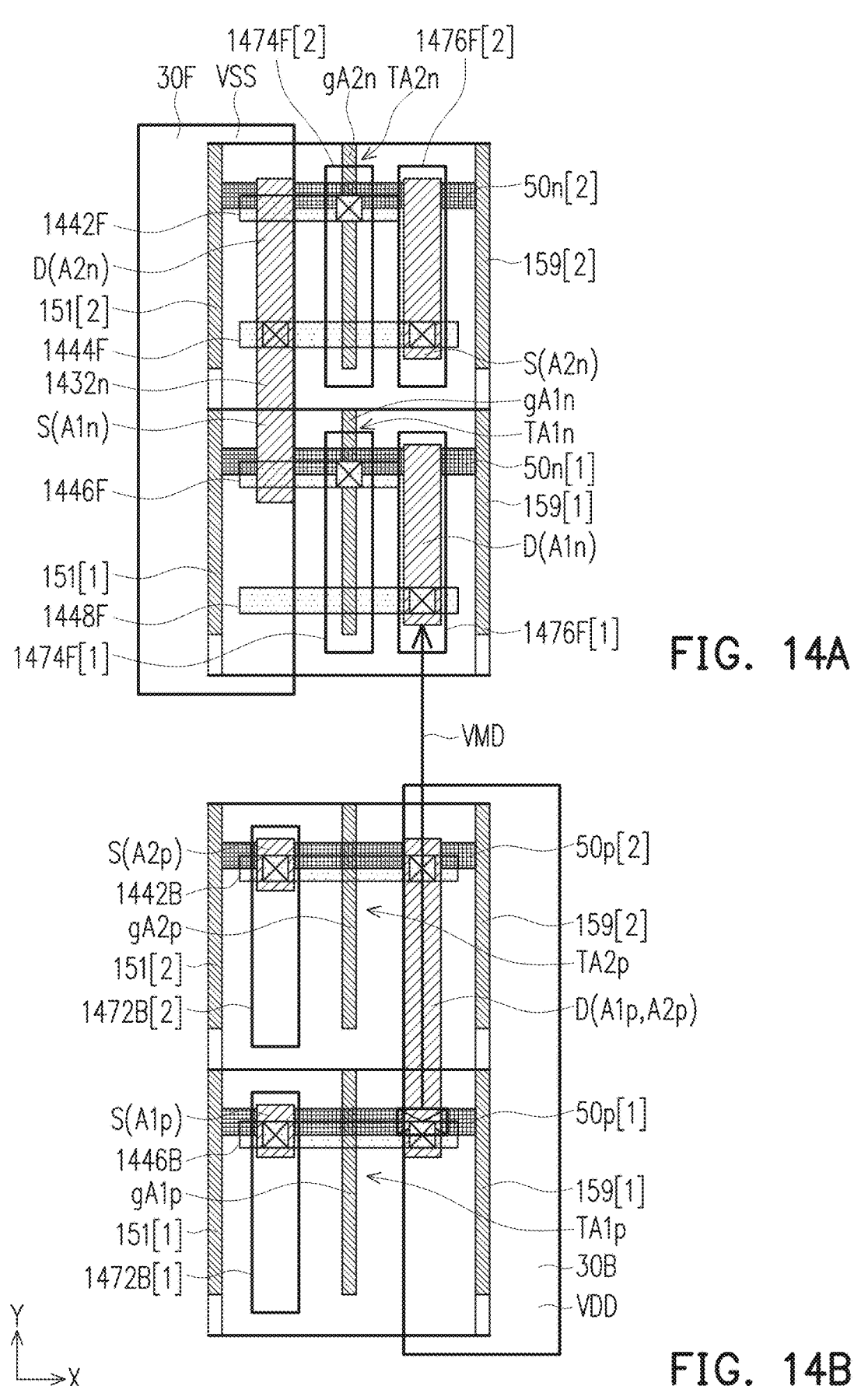
FIGS. 14A-14B are layout diagrams of a NAND circuit, in accordance with some embodiments.

FIGS. 14A-14B are layout diagrams of a NAND circuit, in accordance with some embodiments. The NAND circuit is configured to be powered by a front-side power rail 30F and a back-side power rail 30B. Each of the front-side power rail 30F and the back-side power rail 30B extends in the Y-direction. The front-side power rail 30F is fabricated in a first front-side conductive layer (e.g., a metal layer M0), and the back-side power rail 30B is fabricated in a first back-side conductive layer (e.g., a metal layer BM0). Front-side signal lines 1474F[1]-1474F[2] and 1476F[1]-1476F[2] extending in the Y-direction are also fabricated in the first front-side conductive layer (e.g., the metal layer M0). Back-side signal lines 1472B[1]-1472[2] extending in the Y-direction are also fabricated in the first back-side conductive layer (e.g., the metal layer BM0). Front-side horizontal conducting lines 1442F, 1444F, 1446F, and 1448F extending in the X-direction are fabricated in a second front-side conductive layer (e.g., a metal layer M1), and back-side horizontal conducting lines 1442B and 1446B extending in the X-direction are fabricated in a second back-side conductive layer (e.g., a metal layer BM1). The second front-side conductive layer is above the first front-side conductive layer, while the second back-side conductive layer is below the first back-side conductive layer.

In FIGS. 14A-14B, the NAND circuit is in a circuit cell bounded by vertical cell boundaries aligned with dummy gate-conductors 151[1]-151[2] and 159[1]-159[2]. The gate-conductor gA1 is connected to both the gate terminal of the PMOS transistor TA1$p$ and the gate terminal of the NMOS transistor TA1$n$. The gate-conductor gA2 is connected to both the gate terminal of the PMOS transistor TA2$p$ and the gate terminal of the NMOS transistor TA2$n$. The PMOS transistor TA1$p$ is in a first p-type active-region semiconductor structure 50$p$[1], and the PMOS transistor TA2$p$ is in a second p-type active-region semiconductor structure 50$p$[2]. The NMOS transistor TA1$n$ is in a first n-type active-region semiconductor structure 50$n$[1], and the NMOS transistor TA2$n$ is in a second n-type active-region semiconductor structure 50$n$[2]. The first p-type active-region semiconductor structure 50$p$[1] is below the first n-type active-region semiconductor structure 50$n$[1], thereby forming a first stack of active-region semiconductor structures. The second p-type active-region semiconductor structure 50$p$[1] is below the second n-type active-region semiconductor structure 50$n$[1], thereby forming a second stack of active-region semiconductor structures.

In FIGS. 14B, the source terminal S(A1$p$) of the PMOS transistors TA1$p$ is connected to the back-side signal line 1472B[1] which is further connected to the back-side horizontal conducting line 1446B. The source terminal S(A2$p$) of the PMOS transistors TA2$p$ is connected to the back-side signal line 1472B[2] which is further connected to the back-side horizontal conducting line 1442B. In addition, each of the back-side horizontal conducting line 1446B and the back-side horizontal conducting line 1442B is connected to the back-side power rail 30B through a corresponding back-side via connector VIA0$b$. Consequently, the source terminals of the PMOS transistors TA2$p$ and TB2$p$ are configured to receive the upper supply voltage VDD from the back-side power rail 30B. The drain terminals of the PMOS transistors TA2$p$ and TB2$p$ are connected together with the joint drain terminal D(A1$p$, A2$p$) which is further connected to the drain terminal D(A1$n$) of the NMOS transistor TA1$n$ through a conductive-segment inter-connector VMD.

In FIGS. 14A, the source terminal S(A1$n$) of the NMOS transistor TA1$n$ and the drain terminal D(A2$n$) of the NMOS transistor TA2$n$ are joined together with a conductive segment 1432$n$. The source terminal S(A2$n$) of the NMOS transistor TA2$n$ is connected to the front-side signal line 1476F[2] which is further connected to the front-side horizontal conducting line 1444F through a front-side via connector VIA0. Then, the front-side horizontal conducting line 1444F is connected to the front-side power rail 30F through another front-side via connector VIA0. Consequently, the source terminal S(A2$n$) of the NMOS transistor TA2$n$ is configured receive the lower supply voltage VSS from the front-side power rail 30F.

In FIGS. 14A, the gate-conductor gA1 is connected to the front-side signal lines 1474F[1] which is further connected to the front-side horizontal conducting line 1446F. The gate-conductor gA2 is connected to the front-side signal lines 1474F[2] which is further connected to the front-side horizontal conducting line 1442F. The drain terminal D(A1$n$) of the NMOS transistor TA1$n$ is connected to the front-side signal lines 1476F[1] which is further connected to the front-side horizontal conducting line 1448F. The front-side horizontal conducting lines 1446F and 1442F are configured to carry correspondingly the input signals "A1" and "A2" of the NAND circuit. The front-side horizontal conducting line 1448F is configured to carry the output signal "Z" of the NAND circuit.

Figures 15A, 15B:
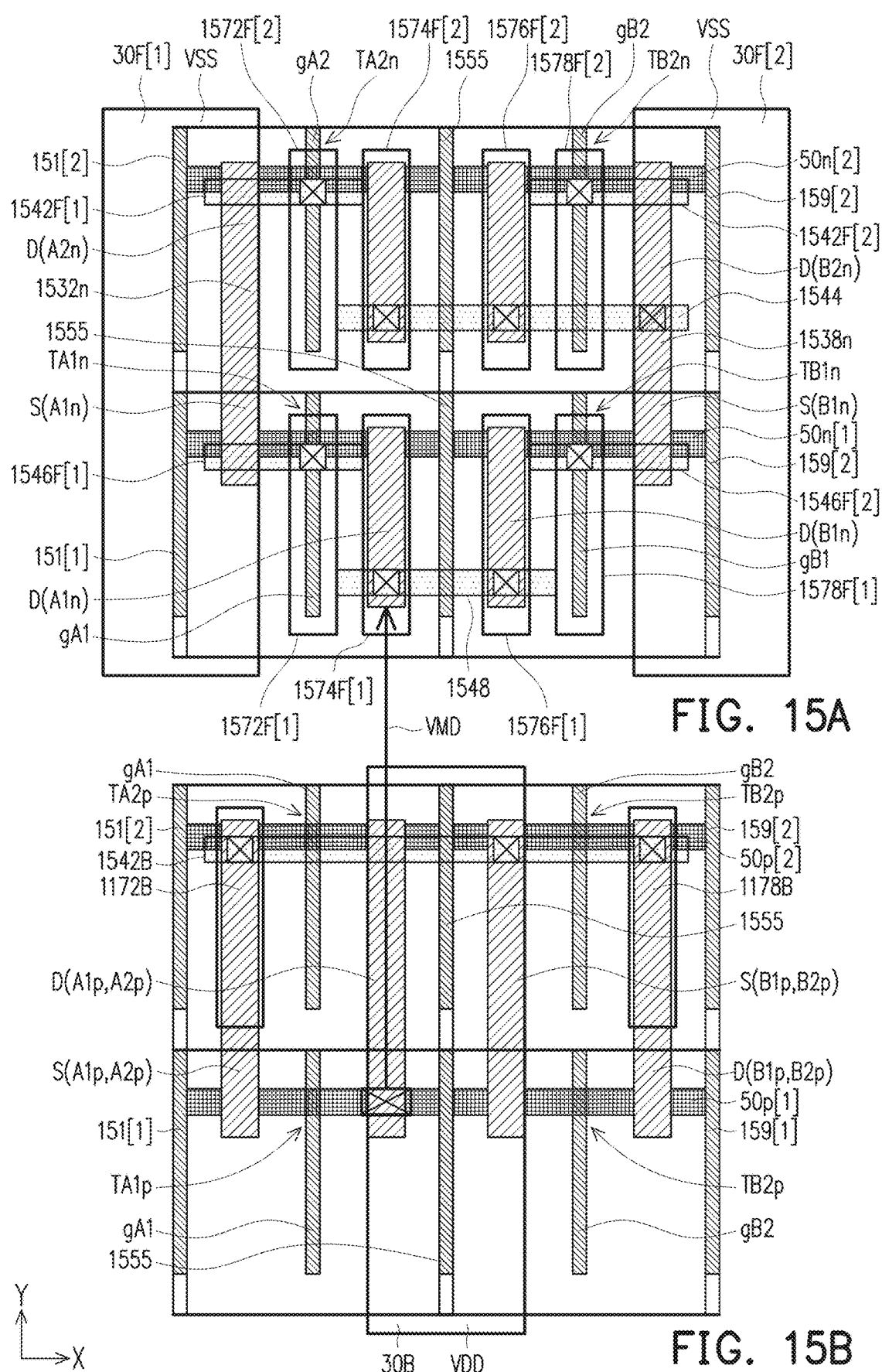
FIGS. 15A-15B are layout diagrams of an AOI circuit, in accordance with some embodiments.

FIGS. 15A-15B are layout diagrams of an AOI circuit, in accordance with some embodiments. The AOI circuit is configured to be powered by front-side power rails 30F[1]-30F[2] and a back-side power rail 30B. Each of the front-side power rails 30F[1]-30F[2] and the back-side power rail 30B extends in the Y-direction. The front-side power rails 30F[1]-30F[2] are fabricated in a first front-side conductive layer (e.g., a metal layer M0), and the back-side power rail 30B is fabricated in a first back-side conductive layer (e.g., a metal layer BM0). Front-side signal lines 1572F[1]-1572F[2], 1574F[1]-1574F[2], 1576F[1]-1576F[2], and 1578F[1]-1578F[2] extending in the Y-direction are also fabricated in the first front-side conductive layer (e.g., the metal layer M0). Back-side signal lines 1572B and 1578B extending in the Y-direction are also fabricated in the first back-side conductive layer (e.g., the metal layer BM0). Front-side horizontal conducting lines 1542F[1]-1542F[2], 1544F, 1546F[1]-1546F[2], and 1548F extending in the X-direction are fabricated in a second front-side conductive layer (e.g., a metal layer M1), and a back-side horizontal conducting lines 1542B extending in the X-direction is fabricated in a second back-side conductive layer (e.g., a metal layer BM1). The second front-side conductive layer is above the first front-side conductive layer, while the second back-side conductive layer is below the first back-side conductive layer.

In FIGS. 15A-15B, the AOI circuit is in a circuit cell bounded by vertical cell boundaries aligned with dummy gate-conductors 151[1]-151[2] and 159[1]-159[2]. The AOI circuit includes gate-conductors gA1, gA2, gB1, and gB2 extending in the Y-direction and dummy gate-conductors 1555 between some of the gate-conductors. The gate-conductor gA1 is connected to both the gate terminal of the PMOS transistor TA1$p$ and the gate terminal of the NMOS transistor TA1$n$. The gate-conductor gA2 is connected to both the gate terminal of the PMOS transistor TA2$p$ and the gate terminal of the NMOS transistor TA2$n$. The gate-conductor gB1 is connected to both the gate terminal of the PMOS transistor TB1$p$ and the gate terminal of the NMOS transistor TB1$n$. The gate-conductor gB2 is connected to both the gate terminal of the PMOS transistor TB2$p$ and the gate terminal of the NMOS transistor TB2$n$.

The PMOS transistors TA1$p$ and TB1$p$ are in a first p-type active-region semiconductor structure 50$p$[1], and the PMOS transistors TA2$p$ and TB2$p$ are in a second p-type active-region semiconductor structure 50$p$[2]. The NMOS transistors TA1$n$ and TB1$nv$ are in a first n-type active-region semiconductor structure 50$n$[1], and the NMOS transistors TA2$n$ and TB2$n$ are in a second n-type active-region semiconductor structure 50$n$[2]. The first p-type active-region semiconductor structure 50$p$[1] is below the first n-type active-region semiconductor structure 50$n$[1], thereby forming a first stack of active-region semiconductor structures. The second p-type active-region semiconductor structure 50$p$[1] is below the second n-type active-region semiconductor structure 50$n$[1], thereby forming a second stack of active-region semiconductor structures.

In FIG. 15B, the joint source terminal S(B1$p$, B2$p$) of the PMOS transistors TB1$p$ and TB2$p$ is connected to the back-side power rail 30B through a back-side via connector VDb. The joint drain terminal D(B1$p$, B2$p$) of the PMOS transistors TB1$p$ and TB2$p$ is connected the back-side signal line 1578B which is further connected to the back-side horizontal conducting line 1542B. The back-side horizontal conducting line 1542B is connected to the back-side signal line 1572B which is further connected to the joint source terminal S(A1$p$, A2$p$) of the PMOS transistors TA1$p$ and TA2$p$. Additionally, the joint drain terminal D(A1$p$, A2$p$) of the PMOS transistors TA1$p$ and TA2$p$ is connected to the drain terminal D(A1$n$) of the NMOS transistor TA1$n$ through a conductive-segment inter-connector VMD.

In FIG. 15A, the drain terminal D(A1$n$) of the NMOS transistor TA1$n$ is connected to the front-side signal line 1574F[1] which is further connected to the front-side horizontal conducting line 1548F. The front-side horizontal conducting line 1548F is connected to the front-side signal line 1576F[1] which is further connected to the drain terminal D(B1$n$) of the NMOS transistor TB In. The source terminal S(A1$n$) of the NMOS transistor TA1$n$ and the drain terminal D(A2$n$) of the NMOS transistor TA2$n$ are joined together with a conductive segment 1532$n$. The source terminal S(B1$n$) of the NMOS transistor TB In and the drain terminal D(B2$n$) of the NMOS transistor TB2$n$ are joined together with a conductive segment 1538$n$. The source terminal S(A2$n$) of the NMOS transistor TA2$n$ is connected to the front-side signal line 1574F[2] which is further connected to the front-side horizontal conducting line 1544F. The source terminal S(B2$n$) of the NMOS transistor TB2$n$ is connected to the front-side signal line 1576F[2] which is further connected to the front-side horizontal conducting line 1544F. In addition, the front-side horizontal conducting line 1544F is connected to the front-side power rail 30F[2]. Consequently, the source terminals of the NMOS transistors TA2$n$ and TB2$n$ are configured to receive the lower supply voltage VSS from the front-side power rail 30F[2].

The gate-conductor gA1 is connected to the front-side signal lines 1572F[1] which is further connected to the front-side signal line 1546F[1]. The gate-conductor gA2 is connected to the front-side signal lines 1572F[2] which is further connected to the front-side horizontal conducting line 1542F[1]. The gate-conductor gB1 is connected to the front-side signal lines 1578F[1] which is further connected to the front-side horizontal conducting line 1546F[2]. The gate-conductor gB2 is connected to the front-side signal lines 1578F[2] which is further connected to the front-side horizontal conducting line 1542F[2]. The front-side horizontal conducting lines 1546F[1], 1542F[1], 1546F[2], and 1542F[2] are configured to carry correspondingly the input signals "A1", "A2", "B1", and "B2" of the AOI circuit. The front-side horizontal conducting line 1548F is configured to carry the output signal "Z" of the AOI circuit.

Figure 16A:
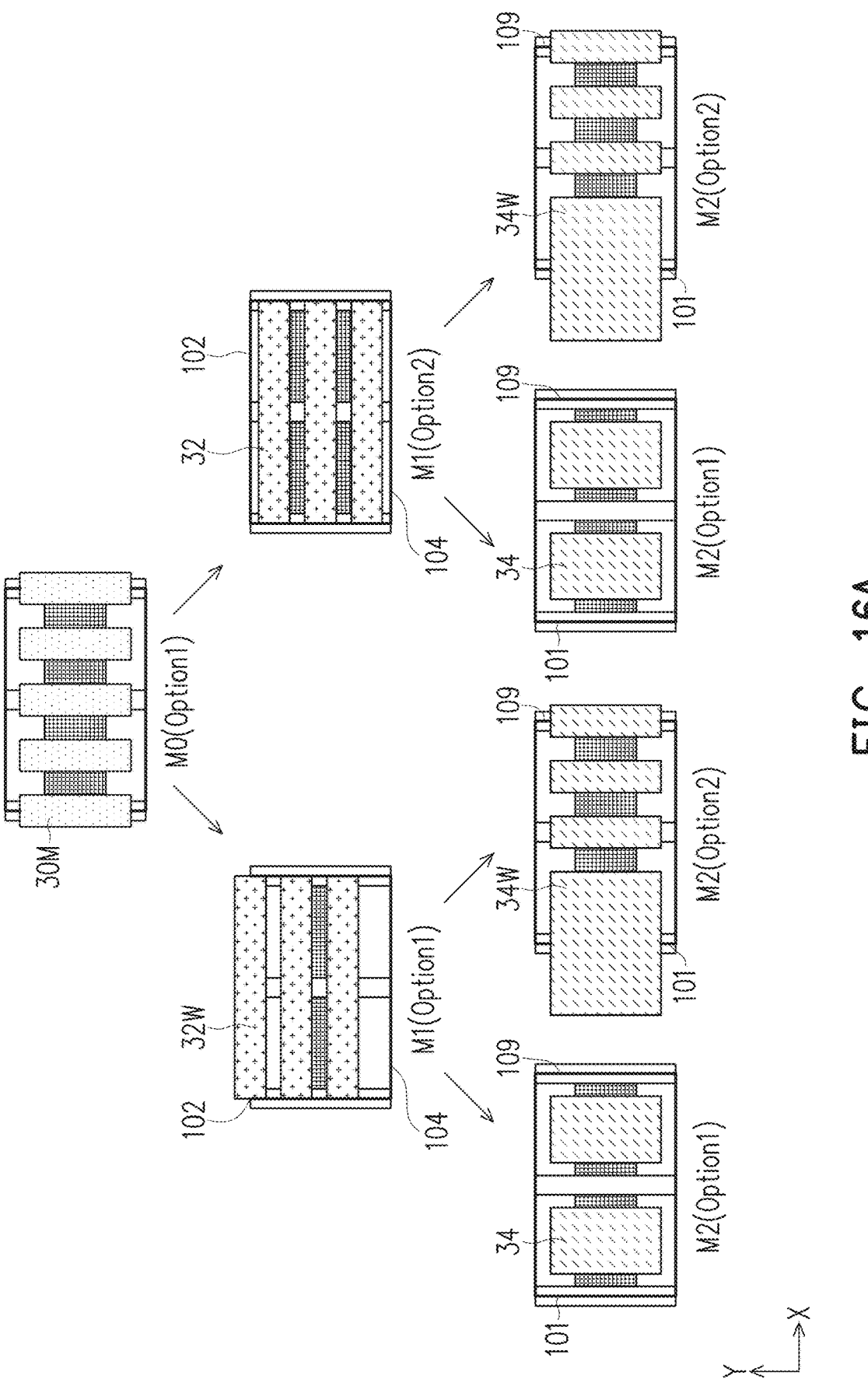
FIGS. 16A-16C are schematic drawings of various designs of power rails in three metal layers, in accordance with some embodiments.
Figure 16B:
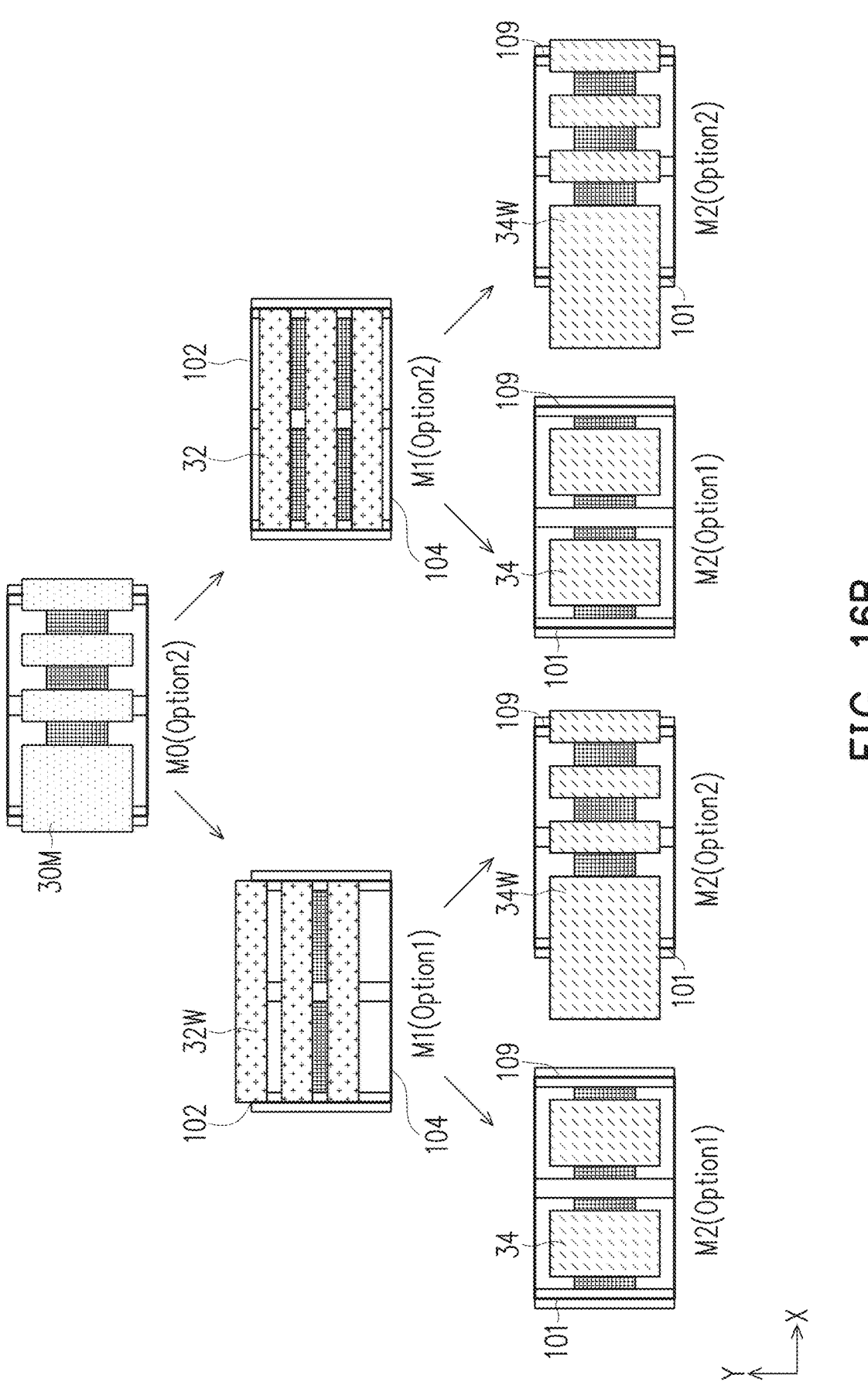
Figure 16C:
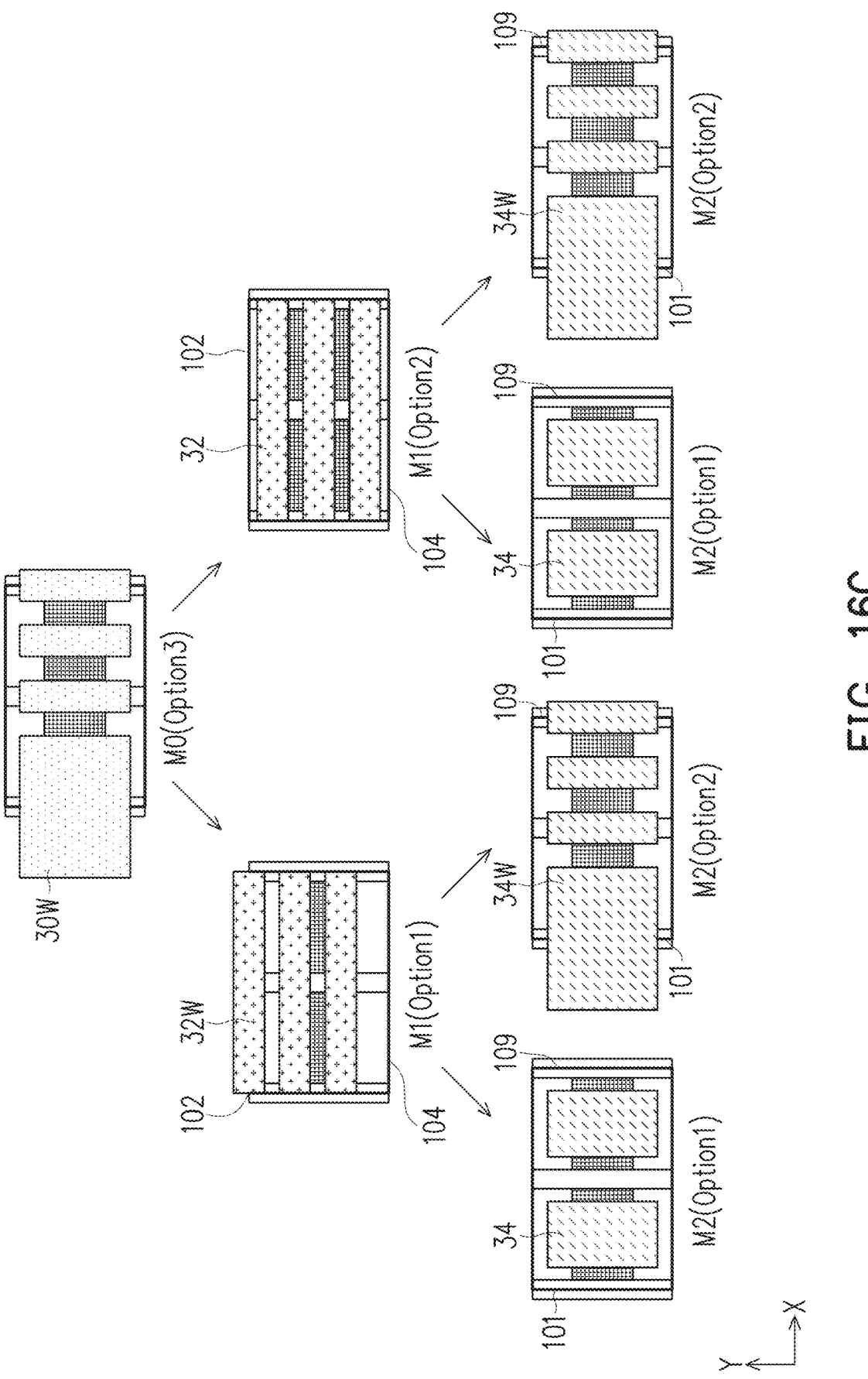

FIGS. 16A-16C are schematic drawings of various designs of power rails in three of the metal layers in the front side or the back side of an integrated circuit, in accordance with some embodiments. The power grids for powering each integrated circuit includes the power rails in a first metal layer, a second metal layer, and a third metal layer. The power rails in the first metal layer (such as the metal layer M0) extend along the Y-direction. The power rails in the second metal layer (such as the metal layer M1) extend along the X-direction. The power rails in the third metal layer (such as the metal layer M2) extend along the Y-direction. The second metal layer is above the first metal layer. The third metal layer is above the second metal layer.

In the examples as provided in FIGS. 16A-16C, three options for implementing the power rails in the first metal layer (such as the metal layer M0) are depicted. In the first option, which is shown in FIG. 16A, a power rail 30 extending in the Y-direction occupies only one vertical routing track. In the second option, which is shown in FIG. 16B, a power rail 30M extending in the Y-direction occupies two vertical routing tracks. In the third option, which is shown in FIG. 16C, a power rail 30W extending in the Y-direction occupies three vertical routing tracks.

For each option of implementing the power rails in the first metal layer (such as the metal layer M0), two options for implementing the power rails in the second metal layer (such as the metal layer M1) are depicted. In the first option, a power rail 32W in the second metal layer (such as the metal layer M1) extending along the X-direction is implemented at a horizontal cell boundary 102. In the second option, a power rail 32 in the second metal layer (such as the metal layer M1) extending along the X-direction is implemented between two horizontal cell boundaries 102 and 104. The width of the power rail 32W at the horizontal cell boundary is wider than the width of the power rail 32 between two horizontal cell boundaries, which causes the power rail 32W to have a smaller IR drop than the power rail 32.

For each option of implementing the power rails in the first metal layer (such as the metal layer M0) and each option for implementing the power rails in the second metal layer (such as the metal layer M1), two options for implementing the power rails in the third metal layer (such as the metal layer M2) extending the Y-direction are depicted. In the first option, a power rail 34 in the third metal layer (such as the metal layer M2) extending the Y-direction is implemented between two vertical cell boundaries 101 and 109. In the second option, a power rail 34W in the third metal layer (such as the metal layer M2) extending the Y-direction is implemented at the vertical cell boundary 101. The width of power rail 34W at the vertical cell boundary is wider than the width of the power rail 34 between two vertical cell boundaries, which causes the power rail 34W to have a smaller IR drop than the power rail 34.

In FIG. 16A, the power rails in the first metal layer (such as the metal layer M0) is implemented for the first option, while for each of the options for implementing the power rails in the second metal layer (such as the metal layer M1), two options for implementing the power rails in the third metal layer (such as the metal layer M2) are depicted. In FIG. 16B, the power rails in the first metal layer (such as the metal layer M0) is implemented for the second option, while for each of the two options for implementing the power rails in the second metal layer (such as the metal layer M1), two options for implementing the power rails in the third metal layer (such as the metal layer M2) are depicted. In FIG. 16C, the power rails in the first metal layer (such as the metal layer M0) is implemented for the third option, while for each of the options for implementing the power rails in the second metal layer (such as the metal layer M1), two options for implementing the power rails in the third metal layer (such as the metal layer M2) are depicted.

FIG. 17 is a flowchart of a method 1700 of manufacturing an integrated circuit (IC) having CFET devices, in accordance with some embodiments. It is understood that additional operations may be performed before, during, and/or after the method 1700 depicted in FIG. 17, and that some other processes may only be briefly described herein.

In operation 1710 of method 1700, a first-type active-region semiconductor structure is fabricated on a substrate. Then, in operation 1712 of method 1700, a first gate-conductor is fabricated, and the first gate-conductor intersects the first-type active-region semiconductor structure. As a non-limiting example, in the embodiments as shown in FIG. 1 and FIGS. 3A-3C, the n-type active-region semiconductor structure 50n is fabricated on a substrate in operation 1710. The lower portion of the gate-conductor 150 is fabricated in operation 1712, and the lower portion of the gate-conductor 150 intersects the n-type active-region semiconductor structure 50n. As another non-limiting example, in the embodiments as shown in FIGS. 13A-13D, the lower portion of the gate-conductor 150 is fabricated in operation 1712 and the lower portion of the gate-conductor 150 intersects the n-type active-region semiconductor structure 50n.

In addition to operation 1712, another operation after operation 1710 is operation 1714. A first conductive segment is fabricated in operation 1714 and the first conductive segment intersects the first-type active-region semiconductor structure. As a non-limiting example, in the embodiments as shown in in FIG. 1 and FIGS. 3A-3C, the conductive segment 132n is fabricated, and the conductive segment 132n (as a source conductive segment) intersects the n-type active-region semiconductor structure 50n and forms a source terminal of the NMOS transistor T1n. In the process flow of method 1700, both operation 1712 and operation 1714 are carried out after operation 1710. In some embodiments, operation 1712 is carried out before operation 1714. In some alternative embodiments, operation 1712 is carried out after operation 1714. After operations 1710, 1712, and 1714, the process flow proceeds to 1720.

In operation 1720 of method 1700, a layer of dielectric material is deposited and covers at least the first-type active-region semiconductor structure, and in operation 1730 of method 1700, a second-type active-region semiconductor structure is fabricated atop the layer of dielectric material. As a non-limiting example, in the embodiments as shown in FIG. 1 and FIGS. 3A-3C, the p-type active-region semiconductor structure 50p is fabricated atop the layer of dielectric material which is above the n-type active-region semiconductor structure 50n. Then, in operation 1732 of method 1700, a second gate-conductor is fabricated and intersects the second-type active-region semiconductor structure. As a non-limiting example, in the embodiments as shown in FIG. 1 and FIGS. 3A-3C, the upper portion of the gate-conductor 150 is fabricated, and the upper portion of the gate-conductor 150 intersects the p-type active-region semiconductor structure 50p.

In some embodiments, the lower portion and the upper portion of the gate-conductor 150 are fabricated correspondingly in operations 1712 and 1732. In some embodiments, the integrated gate-conductor 150 is formed from the lower portion and the upper portion of the gate-conductor. Specifically, before the fabrication of the upper portion of the gate-conductor 150, a gate inter-connector passing through the layer of dielectric material above the n-type active-region semiconductor structure 50n is fabricated, and the gate inter-connector directly connects the lower portion of the gate-conductor 150 with the upper portion of the gate-conductor 150 to form the integrated gate-conductor 150. In some alternative embodiments, the second gate-conductor fabricated in operation 1732 and the first gate-conductor fabricated in operation 1712 are not directly connected with a gate inter-connector. For example, a gate-conductor 150n fabricated in operation 1712 and a gate-conductor 150p fabricated in operation 1732 are formed correspondingly as the gate terminal of a NMOS transistor and the gate terminal of a PMOS transistor, when the NMOS transistor and the PMOS transistor are a circuit cell in which the gate terminals of the NMOS transistor and the PMOS transistor are not directly connected, the gate-conductor 150n and the gate-conductor 150p are consequently also not directly connected.

A second conductive segment is fabricated in operation 1734 and the second conductive segment intersects the second-type active-region semiconductor structure. As a non-limiting example, in the embodiments as shown in FIG. 1 and FIGS. 3A-3C, the conductive segment 132p is fabricated, and the conductive segment 132p (as a source conductive segment) intersects the p-type active-region semiconductor structure 50p and forms a source terminal of the PMOS transistor T1p. In the process flow of method 1700, both operation 1732 and operation 1734 are carried out after operation 1730. In some embodiments, operation 1732 is carried out before operation 1734. In some alternative embodiments, operation 1732 is carried out after operation 1734. After operations 1730, 1732, and 1734, the process flow proceeds to 1740.

In operation 1740 of method 1700, a first insulating material is deposited and covers the second gate-conductor and the second conductive segment. After operation 1740, in operation 1750 of method 1700, a front-side metal layer is deposited over the first insulating material. Then, in operation 1755 of method 1700, the front-side metal layer is patterned to form a front-side power rail and a front-side signal line. Each of the front-side power rail and the front-side signal line extends in a second direction that is perpendicular to the first direction The front-side power rail is conductively connected to the second conductive segment through a front-side via-connector. As a non-limiting example, in the embodiments as shown in FIG. 1 and FIGS. 3A-3C, the front-side power rail 30F and the front-side signal lines 174F and 176F are fabricated in the front-side metal layer overlying the insulating material covering the gate-conductor 150 and the conductive segment 132p. The front-side power rail 30F and the conductive segment 132p are directly connected with a front-side via-connector VD.

After operations 1740, 1750, and 1755, the wafer containing the substrate is flipped in operation 1760. Then, the process flow proceeds to 1770. In operation 1770 of method 1700, a back-side metal layer is formed on a backside of the substrate. After operation 1770, in operation 1775 of method 1700, the back-side metal layer is patterned to form a back-side power rail and a back-side signal line. The back-side power rail is conductively connected to the first conductive segment through a back-side via-connector. As a non-limiting example, in the embodiments as shown in FIG. 1 and FIGS. 3A-3C, the back-side power rail 30B and the back-side signal lines 174B and 176B are fabricated in back-side metal layer at the backside of the substrate. The back-side power rail 30B and the conductive segment 132n are directly connected with a back-side via-connector VDb.

Figure 18:
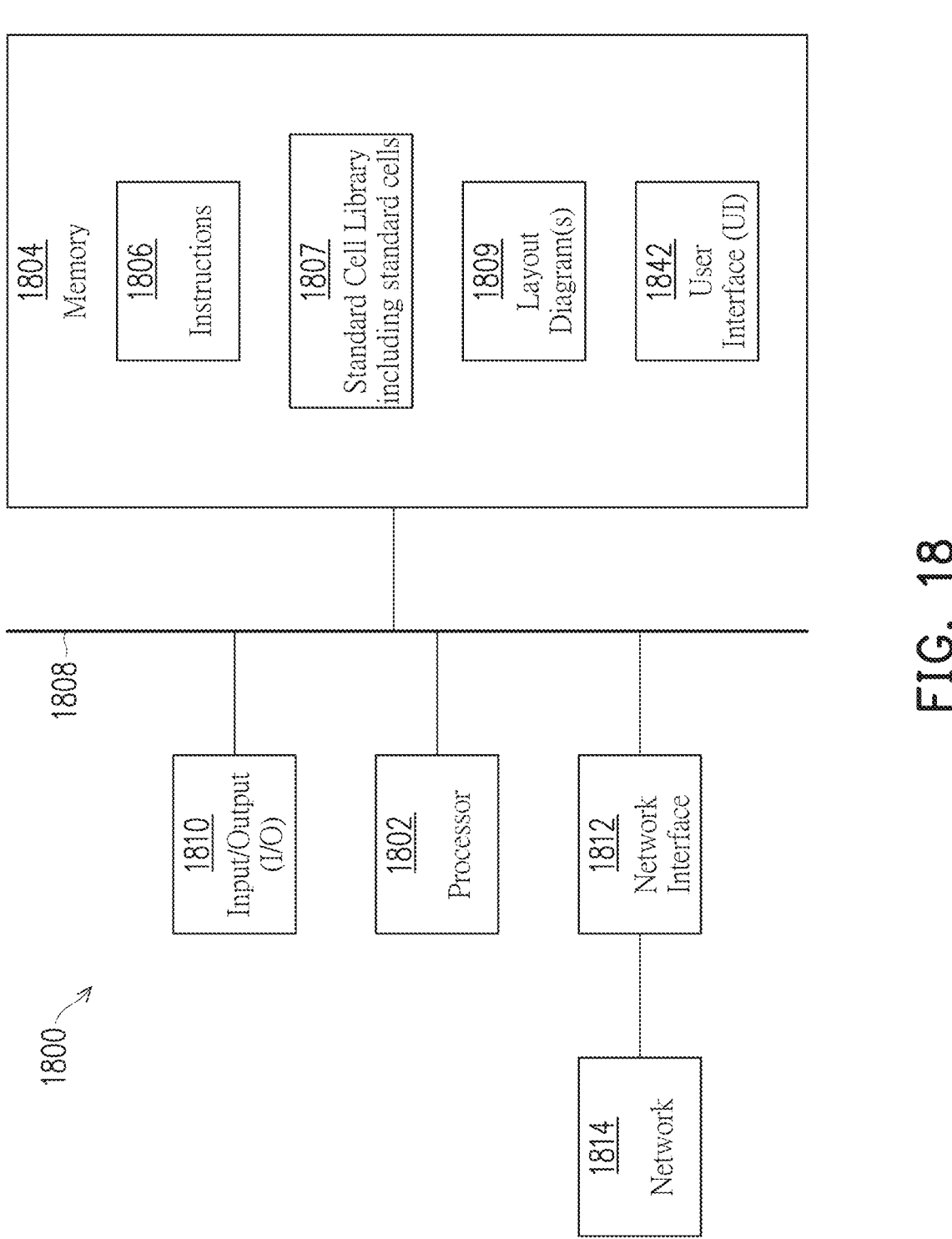
FIG. 18 is a block diagram of an electronic design automation (EDA) system 1800 in accordance with some embodiments.

FIG. 18 is a block diagram of an electronic design automation (EDA) system 1800 in accordance with some embodiments.

In some embodiments, EDA system 1800 includes an automatic placement and routing (APR) system. Methods described herein of designing layout diagrams represent wire routing arrangements, in accordance with one or more embodiments, are implementable, for example, using EDA system 1800, in accordance with some embodiments.

In some embodiments, EDA system 1800 is a general purpose computing device including a hardware processor 1802 and a non-transitory, computer-readable storage medium 1804. Storage medium 1804, amongst other things, is encoded with, i.e., stores, computer program code 1806, i.e., a set of executable instructions. Execution of instructions 1806 by hardware processor 1802 represents (at least in part) an EDA tool which implements a portion or all of the methods described herein in accordance with one or more embodiments (hereinafter, the noted processes and/or methods).

Processor 1802 is electrically coupled to computer-readable storage medium 1804 via a bus 1808. Processor 1802 is also electrically coupled to an I/O interface 1810 by bus 1808. A network interface 1812 is also electrically connected to processor 1802 via bus 1808. Network interface 1812 is connected to a network 1814, so that processor 1802 and computer-readable storage medium 1804 are capable of connecting to external elements via network 1814. Processor 1802 is configured to execute computer program code 1806 encoded in computer-readable storage medium 1804 in order to cause system 1800 to be usable for performing a portion or all of the noted processes and/or methods. In one or more embodiments, processor 1802 is a central processing unit (CPU), a multi-processor, a distributed processing system, an application specific integrated circuit (ASIC), and/or a suitable processing unit.

In one or more embodiments, computer-readable storage medium 1804 is an electronic, magnetic, optical, electromagnetic, infrared, and/or a semiconductor system (or apparatus or device). For example, computer-readable storage medium 1804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1804 includes a compact disk-read only memory (CD-ROM), a compact disk-read/write (CD-R/W), and/or a digital video disc (DVD).

In one or more embodiments, storage medium 1804 stores computer program code 1806 configured to cause system 1800 (where such execution represents (at least in part) the EDA tool) to be usable for performing a portion or all of the noted processes and/or methods. In one or more embodiments, storage medium 1804 also stores information which facilitates performing a portion or all of the noted processes and/or methods. In one or more embodiments, storage medium 1804 stores library 1807 of standard cells including such standard cells as disclosed herein. In one or more embodiments, storage medium 1804 stores one or more layout diagrams 1809 corresponding to one or more layouts disclosed herein.

EDA system 1800 includes I/O interface 1810. I/O interface 1810 is coupled to external circuitry. In one or more embodiments, I/O interface 1810 includes a keyboard, keypad, mouse, trackball, trackpad, touchscreen, and/or cursor direction keys for communicating information and commands to processor 1802.

EDA system 1800 also includes network interface 1812 coupled to processor 1802. Network interface 1812 allows system 1800 to communicate with network 1814, to which one or more other computer systems are connected. Network interface 1812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1800.

System 1800 is configured to receive information through I/O interface 1810. The information received through I/O interface 1810 includes one or more of instructions, data, design rules, libraries of standard cells, and/or other parameters for processing by processor 1802. The information is transferred to processor 1802 via bus 1808. EDA system 1800 is configured to receive information related to a user interface (UI) through I/O interface 1810. The information is stored in computer-readable medium 1804 as UI 1842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 19:
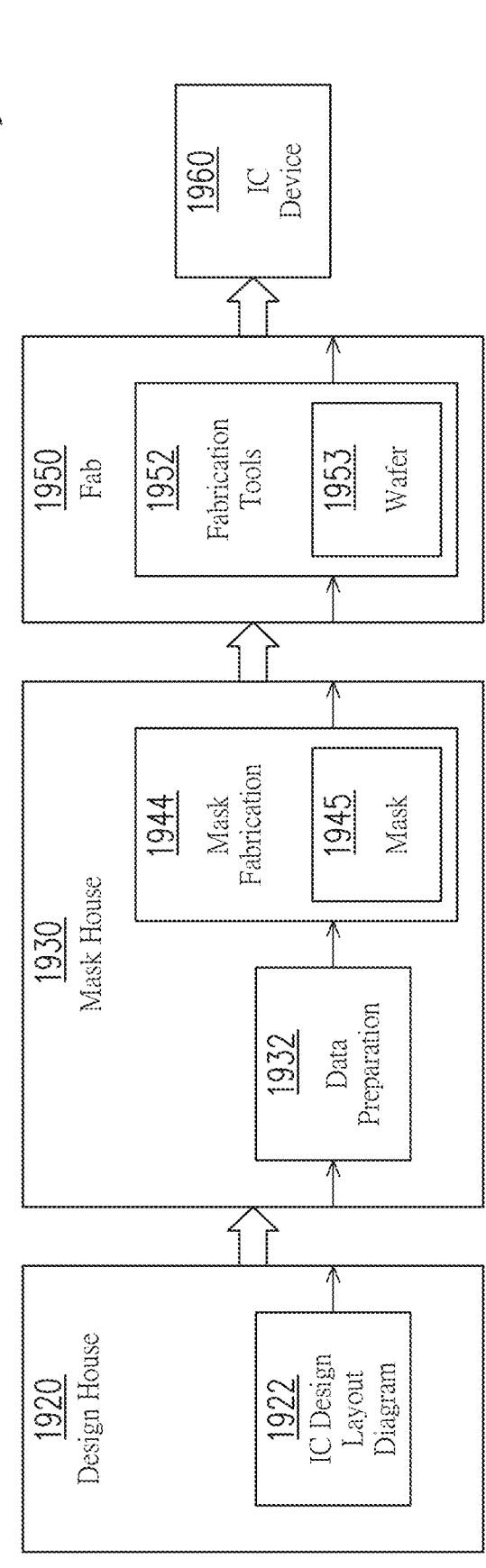
FIG. 19 is a block diagram of an integrated circuit (IC) manufacturing system 1900, and an IC manufacturing flow associated therewith, in accordance with some embodiments.

FIG. 19 is a block diagram of an integrated circuit (IC) manufacturing system 1900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1900.

In FIG. 19, IC manufacturing system 1900 includes entities, such as a design house 1920, a mask house 1930, and an IC manufacturer/fabricator (fab) 1950, that interact with one another in the design, development, and manufacturing cycles and/or services related to manufacturing an IC device 1960. The entities in system 1900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1920, mask house 1930, and IC fab 1950 is owned by a single larger company. In some embodiments, two or more of design house 1920, mask house 1930, and IC fab 1950 coexist in a common facility and use common resources.

Design house (or design team) 1920 generates an IC design layout diagram 1922. IC design layout diagram 1922 includes various geometrical patterns designed for an IC device 1960. The geometrical patterns correspond to patterns of metal, oxide, or semiconductor layers that make up the various components of IC device 1960 to be fabricated. The various layers combine to form various IC features. For example, a portion of IC design layout diagram 1922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1920 implements a proper design procedure to form IC design layout diagram 1922. The design procedure includes one or more of logic design, physical design or place and route. IC design layout diagram 1922 is presented in one or more data files having information of the geometrical patterns. For example, IC design layout diagram 1922 can be expressed in a GDSII file format or DFII file format.

Mask house 1930 includes data preparation 1932 and mask fabrication 1944. Mask house 1930 uses IC design layout diagram 1922 to manufacture one or more masks 1945 to be used for fabricating the various layers of IC device 1960 according to IC design layout diagram 1922. Mask house 1930 performs mask data preparation 1932, where IC design layout diagram 1922 is translated into a representative data file (RDF). Mask data preparation 1932 provides the RDF to mask fabrication 1944. Mask fabrication 1944 includes a mask writer. A mask writer converts the RDF to an image on a substrate, such as a mask (reticle) 1945 or a semiconductor wafer 1953. The design layout diagram 1922 is manipulated by mask data preparation 1932 to comply with particular characteristics of the mask writer and/or requirements of IC fab 1950. In FIG. 19, mask data preparation 1932 and mask fabrication 1944 are illustrated as separate elements. In some embodiments, mask data preparation 1932 and mask fabrication 1944 can be collectively referred to as mask data preparation.

In some embodiments, mask data preparation 1932 includes optical proximity correction (OPC) which uses lithography enhancement techniques to compensate for image errors, such as those that can arise from diffraction, interference, other process effects and the like. OPC adjusts IC design layout diagram 1922. In some embodiments, mask data preparation 1932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1932 includes a mask rule checker (MRC) that checks the IC design layout diagram 1922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1922 to compensate for photolithographic implementation effects during mask fabrication 1944, which may undo part of the modifications performed by OPC in order to meet mask creation rules.

In some embodiments, mask data preparation 1932 includes lithography process checking (LPC) that simulates processing that will be implemented by IC fab 1950 to fabricate IC device 1960. LPC simulates this processing based on IC design layout diagram 1922 to create a simulated manufactured device, such as IC device 1960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1922.

It should be understood that the above description of mask data preparation 1932 has been simplified for the purposes of clarity. In some embodiments, data preparation 1932 includes additional features such as a logic operation (LOP) to modify the IC design layout diagram 1922 according to manufacturing rules. Additionally, the processes applied to IC design layout diagram 1922 during data preparation 1932 may be executed in a variety of different orders.

After mask data preparation 1932 and during mask fabrication 1944, a mask 1945 or a group of masks 1945 are fabricated based on the modified IC design layout diagram 1922. In some embodiments, mask fabrication 1944 includes performing one or more lithographic exposures based on IC design layout diagram 1922. In some embodiments, an electron-beam (e-beam) or a mechanism of multiple e-beams is used to form a pattern on a mask (photomask or reticle) 1945 based on the modified IC design layout diagram 1922. Mask 1945 can be formed in various technologies. In some embodiments, mask 1945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1945 includes a transparent substrate (e.g., fused quartz) and an opaque material (e.g., chromium) coated in the opaque regions of the binary mask. In another example, mask 1945 is formed using a phase shift technology. In a phase shift mask (PSM) version of mask 1945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1944 is used in a variety of processes. For example, such a mask(s) is used in an ion implantation process to form various doped regions in semiconductor wafer 1953, in an etching process to form various etching regions in semiconductor wafer 1953, and/or in other suitable processes.

IC fab 1950 is an IC fabrication business that includes one or more manufacturing facilities for the fabrication of a variety of different IC products. In some embodiments, IC Fab 1950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1950 includes fabrication tools 1952 configured to execute various manufacturing operations on semiconductor wafer 1953 such that IC device 1960 is fabricated in accordance with the mask(s), e.g., mask 1945. In various embodiments, fabrication tools 1952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1950 uses mask(s) 1945 fabricated by mask house 1930 to fabricate IC device 1960. Thus, IC fab 1950 at least indirectly uses IC design layout diagram 1922 to fabricate IC device 1960. In some embodiments, semiconductor wafer 1953 is fabricated by IC fab 1950 using mask(s) 1945 to form IC device 1960. In some embodiments, the IC fabrication includes performing one or more lithographic exposures based at least indirectly on IC design layout diagram 1922. Semiconductor wafer 1953 includes a silicon substrate or other proper substrate having material layers formed thereon. Semiconductor wafer 1953 further includes one or more of various doped regions, dielectric features, multilevel interconnects, and the like (formed at subsequent manufacturing steps).

An aspect of the present disclosure relates to an integrated circuit device. The integrated circuit device includes a first-type active-region semiconductor structure extending in a first direction, a first conductive segment, extending in a second direction perpendicular to the first direction, a second-type active-region semiconductor structure, extending in the first direction, and a second conductive segment, extending in the second direction. The first conductive segment intersects the first-type active-region semiconductor structure at a source region of a first-type transistor. The second-type active-region semiconductor structure is stacked with the first-type active-region semiconductor structure and shifted from the first-type active-region semiconductor structure along a third direction perpendicular to both the first direction and the second direction. The second conductive segment intersects the second-type active-region semiconductor structure at a source region of a second-type transistor. The integrated circuit device also includes a front-side conductive layer and a back-side conductive layer each oriented toward the third direction. The front-side conductive layer is positioned above the first-type active-region semiconductor structure and the second-type active-region semiconductor structure. The back-side conductive layer is positioned below the first-type active-region semiconductor structure and the second-type active-region semiconductor structure. The integrated circuit device further includes a front-side power rail extending in the second direction, in the front-side conductive layer and a back-side power rail extending in the second direction, in the back-side conductive layer. The front-side power rail is configured to maintain a first supply voltage. The back-side power rail extending in the second direction is configured to maintain a second supply voltage. The integrated circuit device still includes a first via-connector directly connected between the first conductive segment and the front-side power rail, and a second via-connector directly connected between the second conductive segment and the back-side power rail.

Another aspect of the present disclosure relates to an integrated circuit device. The integrated circuit device includes a first-type active-region semiconductor structure and a second-type active-region semiconductor structure stacked with the first-type active-region semiconductor structure. Each of the first-type active-region semiconductor structure and the second-type active-region semiconductor structure extends in a first direction. The integrated circuit device also includes a front-side conductive layer and a back-side conductive layer. The front-side conductive layer is above the first-type active-region semiconductor structure and the second-type active-region semiconductor structure. The back-side conductive layer is below the first-type active-region semiconductor structure and the second-type active-region semiconductor structure. The integrated circuit device still includes a plurality of gate-conductors extending in a second direction which is perpendicular to the first direction and a plurality of conductive segments extending in the second direction. Each of the gate-conductors intersects one or both of the first-type active-region semiconductor structure and the second-type active-region semiconductor structure and constructed as a gate terminal of at least one transistor. Adjacent gate-conductors in the plurality of gate-conductors are separated by a pitch distance of one Contacted Poly Pitch ("CPP"). Each of the conductive segments intersect one or both of the first-type active-region semiconductor structure and the second-type active-region semiconductor structure and constructed as a source terminal or a drain terminal of at least one transistor. The integrated circuit device further includes a plurality of front-side power rails extending in the second direction in the front-side conductive layer and a plurality of back-side power rails extending in the second direction in the back-side conductive layer. A front-side power rail is configured to maintain a first supply voltage, and a back-side power rail configured to maintain a second supply voltage. The integrated circuit device further includes a plurality of front-side signal lines between adjacent front-side power rails and a plurality of back-side signal lines between adjacent back-side power rails. Each front-side signal line extends in the second direction in the front-side conductive layer and occupies a front-side conducting line track selected from multiple front-side conducting line tracks that are equally spaced. Each back-side signal line extends in the second direction in the back-side conductive layer and occupies a back-side conducting line track selected from multiple back-side conducting line tracks that are equally spaced.

Still another aspect of the present disclosure relates to a method. The method includes fabricating a first-type active-region semiconductor structure extending in a first direction on a substrate, fabricating a first conductive segment intersecting the first-type active-region semiconductor structure at a first source region of a first-type transistor, fabricating a second-type active-region semiconductor structure extending in the first direction atop a layer of dielectric material, and fabricating a second conductive segment intersecting the second-type active-region semiconductor structure at a second source region of a second-type transistor. The second-type active-region semiconductor structure is stacked with the first-type active-region semiconductor structure. The method also includes depositing a front-side metal layer over a first insulating material and patterning the front-side metal layer to form a front-side power rail, and forming a back-side metal layer on a backside of the substrate and patterning the back-side metal layer to form a back-side power rail extending in the second direction. The front-side power rail extending in a second direction is conductively connected to the second conductive segment through a front-side via-connector. The back-side signal line extending in the second direction is conductively connected to the first conductive segment through a back-side via-connector. The second direction is perpendicular to the first direction.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit device comprising:
   a first-type active-region semiconductor structure extending in a first direction;
   a first conductive segment, extending in a second direction perpendicular to the first direction, intersecting the first-type active-region semiconductor structure at a source region of a first-type transistor;
   a second-type active-region semiconductor structure, extending in the first direction, stacked with the first-type active-region semiconductor structure and shifted from the first-type active-region semiconductor structure along a third direction perpendicular to both the first direction and the second direction;
   a second conductive segment, extending in the second direction, intersecting the second-type active-region semiconductor structure at a source region of a second-type transistor;
   a front-side conductive layer, oriented toward the third direction, positioned above the first-type active-region semiconductor structure and the second-type active-region semiconductor structure;
   a back-side conductive layer, oriented toward the third direction, positioned below the first-type active-region semiconductor structure and the second-type active-region semiconductor structure;
   a front-side power rail extending in the second direction, in the front-side conductive layer, configured to maintain a first supply voltage;
   a back-side power rail extending in the second direction, in the back-side conductive layer, configured to maintain a second supply voltage;
   a first via-connector directly connected between the first conductive segment and the front-side power rail; and
   a second via-connector directly connected between the second conductive segment and the back-side power rail.

2. The integrated circuit device of claim 1, further comprising:
   a first gate-conductor, extending in the second direction perpendicular to the first direction, intersecting the first-type active-region semiconductor structure at a channel region of the first-type transistor; and
   a second gate-conductor, extending in the second direction, intersecting the second-type active-region semiconductor structure at a channel region of the second-type transistor.

3. The integrated circuit device of claim 2, wherein the first gate-conductor is joined with the second gate-conductor and forms a third gate-conductor.

4. The integrated circuit device of claim 2, wherein the first gate-conductor is separated from the second gate-conductor along the third direction by a gate inter-connector passing through a layer of dielectric material.

5. The integrated circuit device of claim 1, further comprising:
   a front-side signal line extending in the second direction, in the front-side conductive layer;
   a back-side signal line extending in the second direction, in the back-side conductive layer; and
   a drain conductive segment, extending in the second direction, intersecting one or both of the first-type active-region semiconductor structure and the second-type active-region semiconductor structure, and conductively connected to the front-side signal line or the back-side signal line through a third via-connector.

6. The integrated circuit device of claim 1, wherein the first-type active-region semiconductor structure is underneath the second-type active-region semiconductor structure.

7. The integrated circuit device of claim 1, wherein the first-type active-region semiconductor structure is above the second-type active-region semiconductor structure.

8. The integrated circuit device of claim 1, wherein each of the first-type active-region semiconductor structure and the second-type active-region semiconductor structure includes at least one nano-sheet.

9. The integrated circuit device of claim 1, wherein each of the first-type active-region semiconductor structure and the second-type active-region semiconductor structure includes at least one nano-wire.

10. An integrated circuit device comprising:
   a first-type active-region semiconductor structure extending in a first direction;
   a second-type active-region semiconductor structure, extending in the first direction, stacked with the first-type active-region semiconductor structure;
   a front-side conductive layer above the first-type active-region semiconductor structure and the second-type active-region semiconductor structure;
   a back-side conductive layer below the first-type active-region semiconductor structure and the second-type active-region semiconductor structure;
   a plurality of gate-conductors, extending in a second direction perpendicular to the first direction, each of the gate-conductors intersecting one or both of the first-type active-region semiconductor structure and the second-type active-region semiconductor structure and constructed as a gate terminal of at least one transistor, wherein adjacent gate-conductors in the plurality of gate-conductors are separated by a pitch distance of one Contacted Poly Pitch ("CPP");
   a plurality of conductive segments, extending in the second direction, each of the conductive segments intersect one or both of the first-type active-region semiconductor structure and the second-type active-region semiconductor structure and constructed as a source terminal or a drain terminal of at least one transistor;
   a plurality of front-side power rails extending in the second direction in the front-side conductive layer, wherein a front-side power rail is configured to maintain a first supply voltage;
   a plurality of back-side power rails extending in the second direction in the back-side conductive layer, wherein a back-side power rail configured to maintain a second supply voltage;
   a plurality of front-side signal lines between adjacent front-side power rails, wherein each front-side signal line extends in the second direction in the front-side conductive layer and occupies a front-side conducting line track selected from multiple front-side conducting line tracks that are equally spaced; and
   a plurality of back-side signal lines between adjacent back-side power rails, wherein each back-side signal line extends in the second direction in the back-side conductive layer and occupies a back-side conducting line track selected from multiple, equally-spaced, back-side conducting line tracks.

11. The integrated circuit device of claim 10, wherein each front-side power rail occupies at least two conducting line tracks selected from the multiple front-side conducting line tracks.

12. The integrated circuit device of claim 10, wherein each front-side power rail occupies at least three conducting line tracks selected from the multiple back-side conducting line tracks.

13. The integrated circuit device of claim 10, wherein the adjacent front-side power rails in the plurality of front-side power rails are separated by a pitch distance of at least four CPPs.

14. The integrated circuit device of claim 10, wherein the adjacent back-side power rails in the plurality of front-side power rails are separated by a pitch distance of at least four CPPs.

15. The integrated circuit device of claim 10, wherein the plurality of front-side power rails extends in the second direction across multiple rows of circuit cells arranged along the first direction.

16. The integrated circuit device of claim 10, wherein the plurality of back-side power rails extends in the second direction across multiple rows of circuit cells arranged along the first direction.

17. The integrated circuit device of claim 10, wherein the plurality of conductive segments includes a first conductive segment conductively connected to the front-side power rail through a first via-connector, and wherein the plurality of conductive segments includes a second conductive segment conductively connected to the back-side power rail through a second via-connector.

18. The integrated circuit device of claim 10, wherein a via-connector is directly connected between the front-side power rail and a conductive segment in the plurality of conductive segments.

19. The integrated circuit device of claim 10, wherein a via-connector is directly connected between the back-side power rail and a conductive segment in the plurality of conductive segments.

20. An integrated circuit device comprising:

a first-type active-region semiconductor structure extending in a first direction;

a first conductive segment, extending in a second direction perpendicular to the first direction, intersecting the first-type active-region semiconductor structure at a source region of a first-type transistor;

a second-type active-region semiconductor structure, extending in the first direction, stacked with the first-type active-region semiconductor structure and shifted from the first-type active-region semiconductor structure along a third direction perpendicular to both the first direction and the second direction;

a second conductive segment, extending in the second direction, intersecting the second-type active-region semiconductor structure at a source region of a second-type transistor;

a front-side conductive layer, oriented toward the third direction, positioned above the first-type active-region semiconductor structure and the second-type active-region semiconductor structure;

a back-side conductive layer, oriented toward the third direction, positioned below the first-type active-region semiconductor structure and the second-type active-region semiconductor structure;

a front-side power rail and a front-side signal line extending in the second direction in the front-side conductive layer, wherein the front-side power rail is configured to be maintained at a first supply voltage;

a back-side power rail and a back-side signal line extending in the second direction in the back-side conductive layer, wherein the back-side power rail is configured to be maintained at a second supply voltage;

a first via-connector directly connected between the first conductive segment and the front-side power rail; and a second via-connector directly connected between the second conductive segment and the back-side power rail.

* * * * *